(12) United States Patent
Mizuno et al.

(10) Patent No.: US 7,221,463 B2
(45) Date of Patent: May 22, 2007

(54) POSITIONING APPARATUS, EXPOSURE APPARATUS, AND METHOD FOR PRODUCING DEVICE

(75) Inventors: Makoto Mizuno, Tochigi (JP); Ryo Nawata, Tochigi (JP); Mitsuru Inoue, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 432 days.

(21) Appl. No.: 10/798,812

(22) Filed: Mar. 10, 2004

(65) Prior Publication Data

US 2004/0179192 A1 Sep. 16, 2004

(30) Foreign Application Priority Data

Mar. 14, 2003 (JP) .............................. 2003-070037
Apr. 25, 2003 (JP) .............................. 2003-121915

(51) Int. Cl.
*G01B 11/14* (2006.01)
*G03B 27/42* (2006.01)

(52) U.S. Cl. .......................................... 356/614; 355/53
(58) Field of Classification Search ................ 356/614, 356/124; 355/53, 72–76; 310/10–12; 318/611, 318/649, 653, 6
See application file for complete search history.

(56) References Cited

U.S. PATENT DOCUMENTS

| | | | | |
|---|---|---|---|---|
| 4,485,339 A | * | 11/1984 | Trost ............................ | 318/640 |
| 4,886,570 A | * | 12/1989 | Davis et al. ................. | 438/711 |
| 5,140,242 A | * | 8/1992 | Doran et al. ................. | 318/640 |
| 5,172,160 A | * | 12/1992 | Van Eijk et al. .............. | 355/53 |
| 5,654,553 A | * | 8/1997 | Kawakubo et al. ......... | 250/548 |
| 5,986,827 A | | 11/1999 | Hale | |
| 6,081,581 A | * | 6/2000 | Hasegawa ................... | 378/145 |
| 6,184,596 B1 | * | 2/2001 | Ohzeki ........................ | 310/12 |
| 6,355,994 B1 | * | 3/2002 | Andeen et al. ............... | 310/15 |
| 6,437,864 B1 | * | 8/2002 | Watanabe et al. ........... | 356/399 |
| 6,477,898 B1 | * | 11/2002 | Han et al. ..................... | 73/579 |
| 6,603,531 B1 | * | 8/2003 | Binnard ........................ | 355/53 |
| 6,671,039 B2 | * | 12/2003 | Yoda et al. .................. | 356/127 |
| 6,841,323 B2 | * | 1/2005 | Nishi ........................... | 430/30 |
| 6,873,478 B2 | * | 3/2005 | Watson ........................ | 359/819 |
| 6,879,375 B1 | * | 4/2005 | Kayama ....................... | 355/53 |
| 6,922,293 B2 | * | 7/2005 | Watson et al. ............... | 359/819 |
| 6,940,582 B1 | * | 9/2005 | Tanaka ......................... | 355/53 |
| 7,057,193 B2 | * | 6/2006 | Akutsu ....................... | 250/492.22 |
| 2001/0055117 A1 | * | 12/2001 | Mizutani ..................... | 356/401 |
| 2002/0018192 A1 | * | 2/2002 | Nishi ........................... | 355/53 |
| 2002/0163741 A1 | * | 11/2002 | Shibazaki .................... | 359/819 |
| 2002/0166982 A1 | * | 11/2002 | Kataoka et al. ............. | 250/548 |
| 2003/0035090 A1 | * | 2/2003 | Imai et al. .................... | 355/53 |
| 2003/0121022 A1 | * | 6/2003 | Yoshitake et al. ............ | 716/21 |
| 2004/0227915 A1 | * | 11/2004 | Ohtsuka ...................... | 355/52 |

FOREIGN PATENT DOCUMENTS

JP      2000-357651      12/2000

*Primary Examiner*—Layla G. Lauchman
*Assistant Examiner*—J. Underwood
(74) *Attorney, Agent, or Firm*—Morgan & Finnegan, LLP

* cited by examiner

(57) ABSTRACT

The present invention provides a positioning apparatus capable of performing six-axis micro adjustment of an optical element in an exposure apparatus with high accuracy, and the exposure apparatus. The positioning apparatus of the present invention includes a first measurement unit for measuring a position/inclination of a moving part having an optical element while being kept from contact with the moving part, and a driving unit capable of driving the moving part in directions of six axes with respect to a fixed part while being kept from contact with the moving part, based on the result of measurement by the first measurement unit.

55 Claims, 24 Drawing Sheets

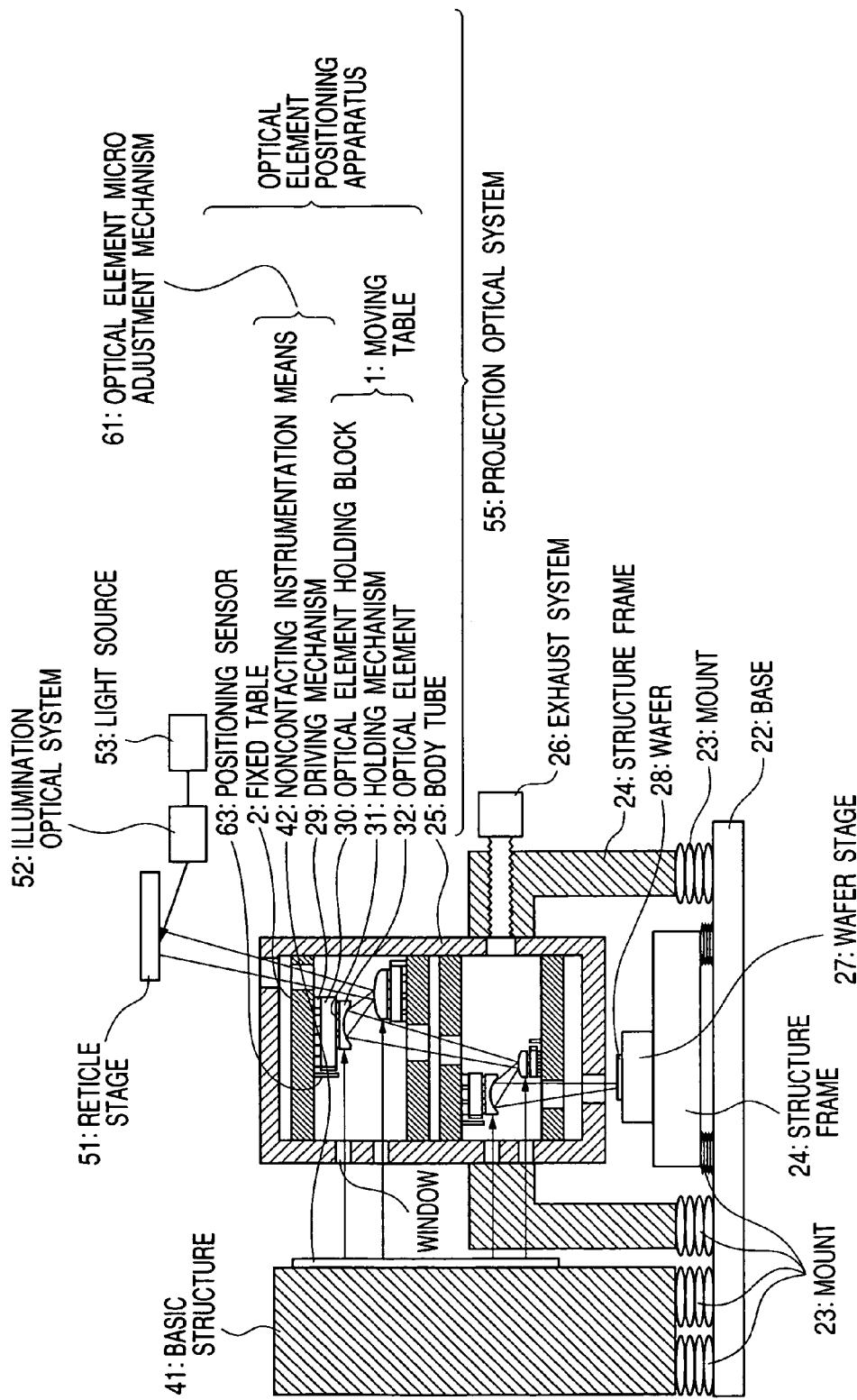

POSITIONING APPARATUS, EXPOSURE APPARATUS, AND METHOD FOR PRODUCING DEVICE

BACKGROUND OF THE INVENTION

1. Field of the Invention

This invention relates to a precise adjustment drive apparatus, particularly an apparatus for finely adjusting postures of optical elements (lens, mirror, etc.) of an exposure apparatus for use in steps of producing a semiconductor or liquid crystal device. More specifically, the posture adjustment is performed for obtaining a more correct relation of image formation when an image of an original plate (e.g. mask or reticle) is projected and exposed on an object (e.g. wafer) with optical elements.

2. Related Background Art

A semiconductor exposure apparatus is an apparatus transferring an original plate (e.g. reticle) having a large number of different types of patterns to a silicon wafer (substrate). For fabricating a circuit having a high integration degree, it is essential to improve not only a resolution performance but also superimposition accuracy.

Superimposition errors in the semiconductor exposure apparatus are classified into an alignment error, image deformation and a magnification error. The alignment error can be alleviated by adjustment of a relative position between the original plate (reticle) and the substrate (wafer). On the other hand, the image deformation and the magnification error can be adjusted by moving some of optical elements of an optical system. If some optical elements are moved in a direction other than a desired direction of movement, or the optical element is decentered or inclined when some optical elements are moved, a desired optical performance (optical performance with image deformation and the magnification error corrected) cannot be obtained. For example, if it is necessary to move the optical element along the optical axis, parallel decentering and inclination decentering error components should be prevented from growing.

As an optical element movement apparatus for semiconductor exposure apparatus, an apparatus with a mechanism using a parallel plate has been devised (Japanese Patent Application Laid-Open No. 2000-357651). FIGS. 15A and 15B are a top view and a sectional view, respectively, of the conventional optical element moving apparatus.

As shown in these figures, in the conventional optical element moving apparatus, a ring-like flat spring 11 having a moving table 1 holding an adjustment lens 7 for adjusting a magnification, an aberration and the like of an optical system and a cell 8 supporting the adjustment lens 7, and a fixed table 2 is fixed on both end faces of the moving table 1 and the fixed table 2 in a sealed manner. The moving table 1 has a cylindrical shape, but the outer diameter of the upper face is unequal to the outer diameter of the lower face. Furthermore, similarly, the fixed table 2 also has a cylindrical shape, the inner diameter of the opening of the upper face is unequal to the inner diameter of the opening of the lower face. The fixed table 2 has at least one hole, and can change the position of a moving part by a change in pressure or volume of a driving fluid.

Other examples of the conventional technique include an optical element micro adjustment apparatus described in U.S. Pat. No. 5,986,827, but in the structure thereof, adjustment is limited to micro adjustment of three axes, and adjustment within the optical element surface cannot be performed, and therefore the apparatus is not sufficient for applications precise adjustment of positions and postures of optical elements.

Furthermore, another example of the conventional technique is an apparatus described in Japanese Patent Application Laid-Open No. 2002-131605, but it utilizes a contraction mechanism using a long lever (long distance between support point and power point or action point), and is therefore expected to have a low specific frequency. The low specific frequency is disadvantageous for applications requiring precise adjustment of positions and postures because vibrations from outside the apparatus are transferred to a moving part. Furthermore, the low specific frequency is disadvantageous when high-speed drive is required.

In Japanese Patent Application Laid-Open No. 2000-357651, other parallel decentering and inclination decentering components associated with optical elements depend on guidance accuracy of a flat spring guide. Furthermore, the initial position and posture of the optical element depend on assembly accuracy of apparatus. However, as semiconductor device patterns have become more precise, higher position and posture accuracy than ever and drive positioning accuracy for correction of aberrations and the like have been required for the optical element. Thus, the apparatus driving only one axis or three axes, described in Japanese Patent Application 2000-357651 or U.S. Pat. No. 5,986,827 is not sufficient, and an apparatus capable of adjusting total six axes of orthogonal three axes in the translational direction and three axes about the translational axes is desired.

Furthermore, for alleviating a positional shift of the optical element due to vibrations from outside the apparatus, a six-axis adjusting mechanism provided therein a mechanism for preventing transfer of external vibrations to the optical element is desired.

Further, in recent years, as semiconductor patterns have become more precise, an exposure apparatus using light having a short wavelength (e.g. light having a wavelength of 10 to 15 nm, such as EUV light) has been devised. For obtaining a relation of image formation required for the exposure apparatus using EUV light, higher position and posture accuracy than ever and drive positioning accuracy for correction of aberrations and the like have been required for the optical element. However, if means for measuring a position from a basic structure can measure only a relative displacement with a moving part, a positioning sensor for positioning the moving part with respect to a reference (e.g. fixed part) is required. If the moving part is positioned with respect to the fixed part based on the result of detection by the positioning sensor, an imposition error of the fixed part and a measurement error of the positioning sensor appear as a positioning error of the moving part.

Alternatively, for obtaining the required relation of image information, an apparatus capable of controlling a relative position between moving parts including different optical elements.

Furthermore, the optical element is expected to have an elevated temperature due to exposure heat to cause thermal distortion. If the optical element is thermally distorted, the exposure apparatus no longer satisfies the required relation of image formation, and therefore it is necessary to cool the optical element. Particularly, positioning accuracy in the order of nanometers is required for the optical element of the EUV exposure apparatus, and therefore cooling means transferring no vibrations to the optical element should be used.

Furthermore, since EUV light is easily absorbed by a material, the amount of light decreases if a contamination (hydrocarbon compound generated from the wafer) occurs. Further, there arises a problem such that EUV light reacts with the contamination to deposit carbon and the like on the surface of the optical element, thus reducing a reflectivity of the optical element. Thus, the partial pressure of contamination in a body tube space through which EUV light passes should be kept at a low level.

Thus, the exemplary object of the present invention is to provide a positioning apparatus capable of performing positioning control of optical elements in directions of six axes with high accuracy, and an exposure apparatus.

SUMMARY OF THE INVENTION

According to the present invention, there is provided a positioning apparatus comprising:

first measurement means for measuring a position/inclination of a moving part having an optical element while being kept from contact with said moving part; and driving means capable of driving said moving part in directions of six axes with respect to a fixed part while being kept from contact with said moving part, based on the result of measurement by said first measurement means.

According to the other present invention, there is provided a positioning apparatus comprising:

a first moving part including an optical element;
a first fixed part;
first driving means for driving said first moving part with respect to said first fixed part;
first measurement means for measuring a position of said first moving part with respect to said first fixed part;
second measurement means for measuring a displacement of said first moving part with respect to a basic structure; and
a first compensator controlling said first driving means based on the result of measurement by said second measurement means, wherein said optical element is positioned using said first driving means, said second measurement means and said first compensator, based on the result of measurement by said first measurement means.

According to the other present invention, there is provided a positioning apparatus comprising:

a first moving part including a first optical element;
a first fixed part;
first driving means for driving said first moving part with respect to said first fixed part;
a second moving part including a second optical element;
a second fixed part;
second driving means for driving said second moving part with respect to said second fixed part;
third measurement means for measuring a relative displacement between said first moving part and said second moving part;
a first compensator controlling said first driving means based on information of measurement by said third measurement means; and
a second compensator controlling said second driving means based on information of measurement by said third measurement means, wherein said first optical element and said second optical element are positioned using said first compensator and said second compensator.

BRIEF DESCRIPTION OF THE DRAWINGS

FIG. 16 is a schematic illustration of third Example, showing an outline of an exposure apparatus;

DESCRIPTION OF THE PREFERRED EMBODIMENTS

FIRST EXAMPLE

Figure 1:
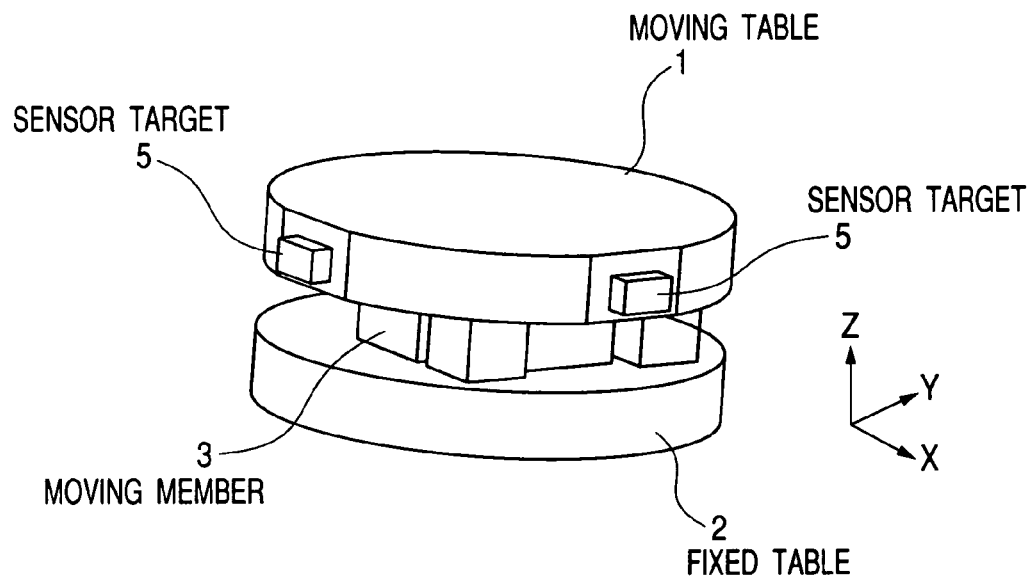
FIG. 1 shows an optical element micro adjustment mechanism using a linear motor of first Example.
Figure 5:
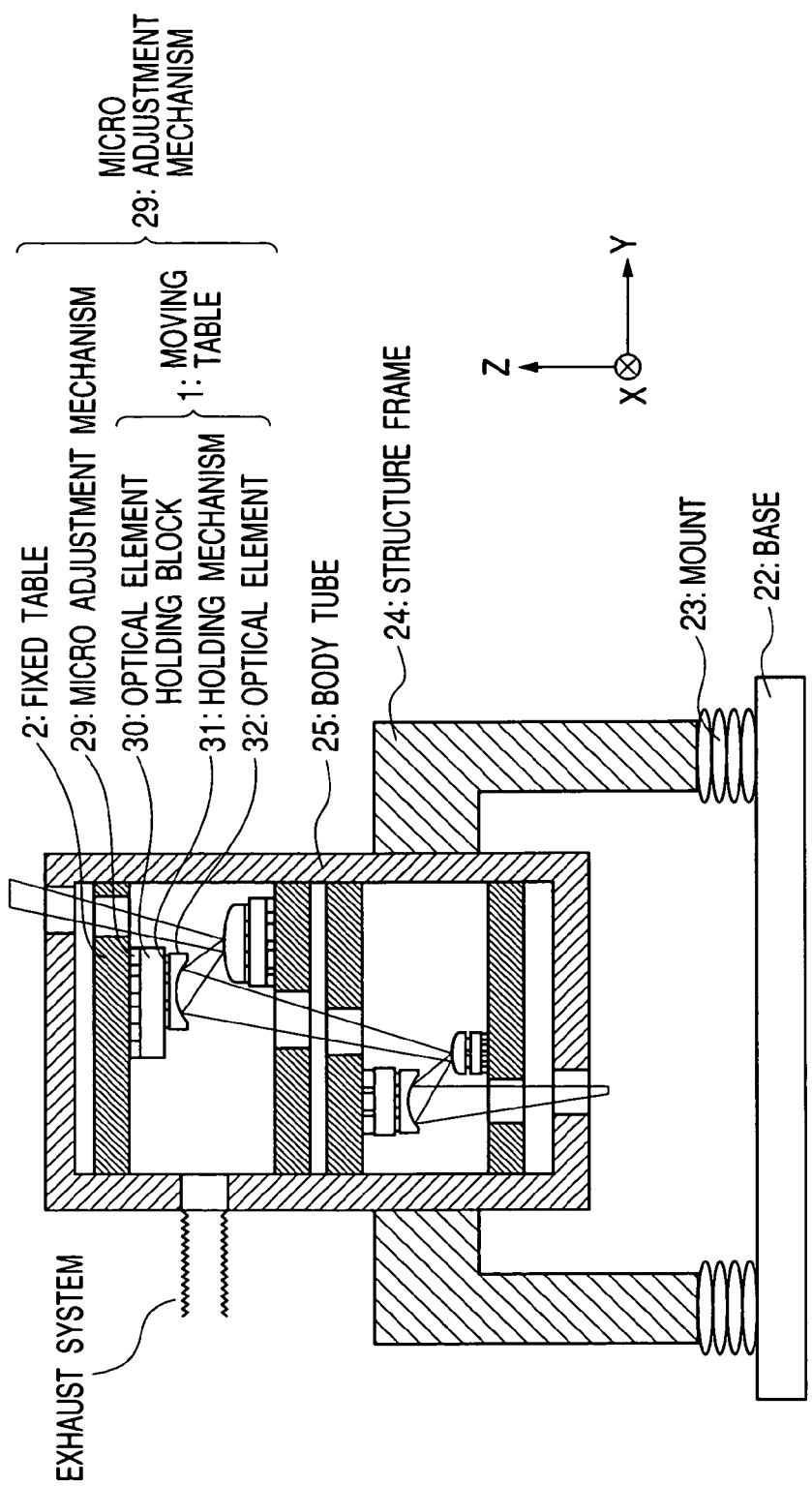
FIG. 5 shows an outline of a general view of an apparatus provided with optical elements of first Example.

FIGS. 1 and 5 are schematic illustrations of the first embodiment of the present invention. FIG. 5 shows an example of an exposure apparatus, in which an illumination optical system guiding light from a light source to a mask (reticle), a mask stage supporting and driving the mask, and the like are not shown, but only a projection optical system guiding light from the mask to a wafer (exposed body) and a structure supporting the projection optical system are shown. Furthermore, FIG. 1 is a perspective view of only an enlarged micro adjustment mechanism shown in FIG. 5.

An optical element six-axis micro adjustment mechanism 29 of the present invention is installed in a body tube 25 on a structure frame 24 supported on a mount 23. FIG. 5 shows an example in which total four micro adjustment mechanisms 29 are placed in the body tube 25. Of course, if the number of optical elements varies, the number of micro adjustment mechanisms should be changed according to the number of optical elements. For example, there are preferably six micro adjustment mechanisms if six optical systems exist, and there are preferably eight micro adjustment mechanisms if eight optical elements exist. Furthermore, it is not necessary to provide micro adjustment mechanisms for all optical elements, and the number of micro adjustment mechanisms may be smaller than the number of optical elements.

A mechanism described in this embodiment is such that a moving table 1 can move in directions of six axes in a noncontact manner with respect to a fixed table 2. Here, the directions of six axes refer to X, Y and Z directions and directions of rotation about X, Y and Z axes.

The moving table 1 is a mirror or lens being an optical element 32. Alternatively, in addition to the lens or mirror, the moving table 1 may include a holding member for supporting the mirror or lens.

An actuator is a driving mechanism for driving the moving table 1 with respect to the fixed table 2. Here, the actuator has X actuators for driving the moving table 1 in the X direction, Y actuators for driving the moving table 1 in the Y direction, and Z actuators for driving the moving table 1 in the Z direction. A plurality of actuators are provided as at least one of the X actuator and the Y actuator. Here, if there are two Y actuators, for example, use of these Y actuators allows the moving table 1 to be driven not only in the Y direction but also in the direction of rotation (θ) about the Z axis. Furthermore, at least three Z actuators are provided. These three or more Z actuators allow a micro adjustment stage to be driven not only in the Z direction but also in the inclination direction (directions of rotation about X and Y axes).

Here, if the moving table 1 is supported against the fixed table 2 in directions of six axes in a noncontact manner, it is expected that heat is generated in the actuator. Thus, by providing a cooling mechanism in the actuator, generated heat can be inhibited from leaking to outside the actuator.

A linear motor being a noncontacting driving mechanism is desirable as the actuator. In this case, it is desirable that a coil is provided on the fixed table 2 side as a fixed member, and a permanent magnet is provided on the moving table 1 side as a moving member for convenience in wiring and the like. The cooling mechanism is used for cooling the coil and the like. For one example of the cooling mechanism, the coil is covered with a jacket, and a cooling liquid is supplied into the jacket to cool the coil. If a cooling mechanism using a jacket is provided in the linear motor for making a micro adjustment, the changeover of the coil is eliminated, and therefore the coil can be cooled with a relatively simple configuration. Furthermore, the coil may be cooled by radiation. In the case where the coil is cooled by radiation, the optical element may have a configuration capable of being cooled together with the coil.

The details of the micro adjustment mechanism 29 using the linear motor will be described below.

The moving table 1 is provided with moving members 3 constituting the linear motor. In FIG. 1, all the moving members 3 are provided on the back surface of the moving table 1, but some or all of the moving members 3 may be provided on the side face or the like of the moving table 1.

On the other hand, the fixed table 2 is provided with fixed members 4 constituting the linear motor (not shown in FIG. 1).

Figure 2:
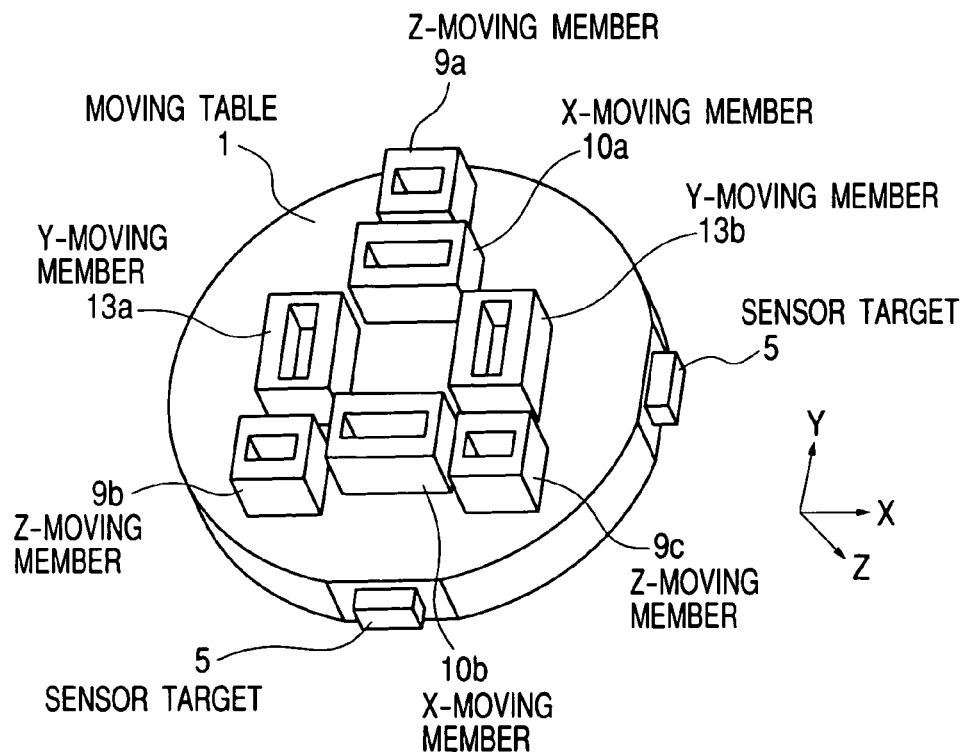
FIG. 2 shows a layout of a moving member on a moving table of first Example.
Figure 3:
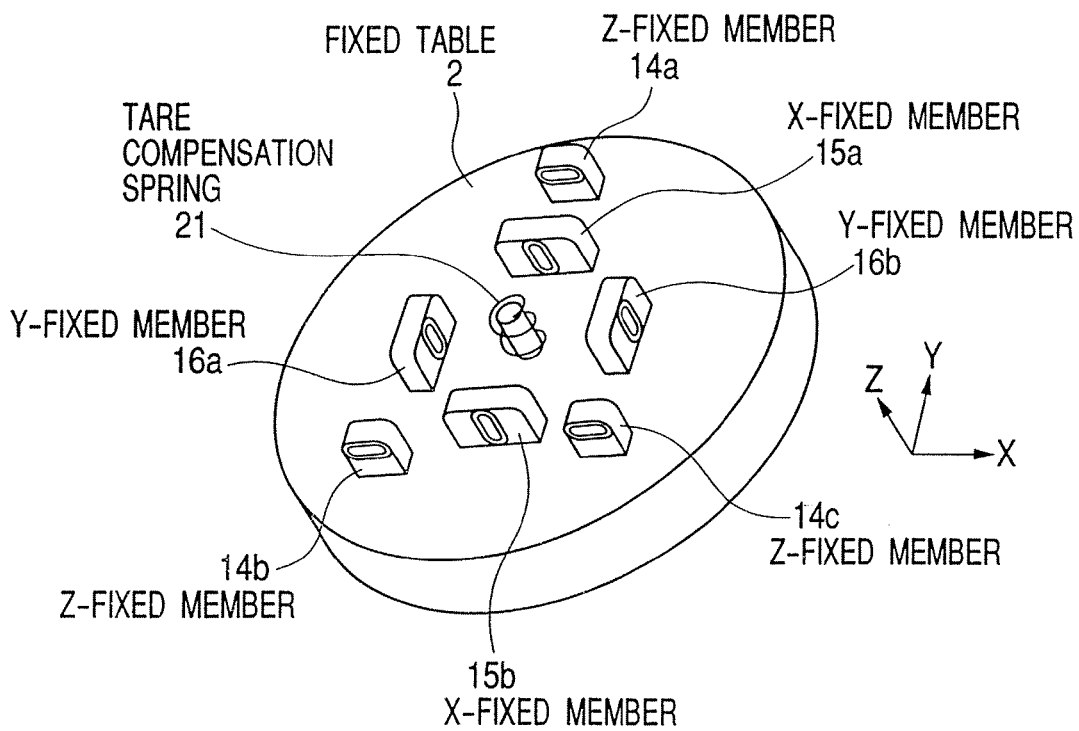
FIG. 3 shows a layout of a fixed member on a fixed table of first Example.

The mounting of the linear motor will be described in detail with reference to the perspective views of the moving table 1 and the fixed table 2 shown in FIGS. 2 and 3, respectively.

The moving table 1 is provided on the back surface with seven micro adjustment linear motor moving members 3. Each moving member 3 has two pairs of bipolar magnets 17 polarized in the direction of thickness of the moving table (substantially identical to the direction of the optical axis of the optical element) and yokes 19 (see FIG. 4). The two pairs of magnets 17 and yokes 19 are coupled together at a side plate 20 to form a box-like structure, and face each other in such a manner as to sandwich therebetween a micro adjustment linear motor fixed member 4 described later in a noncontact manner.

Figure 4:
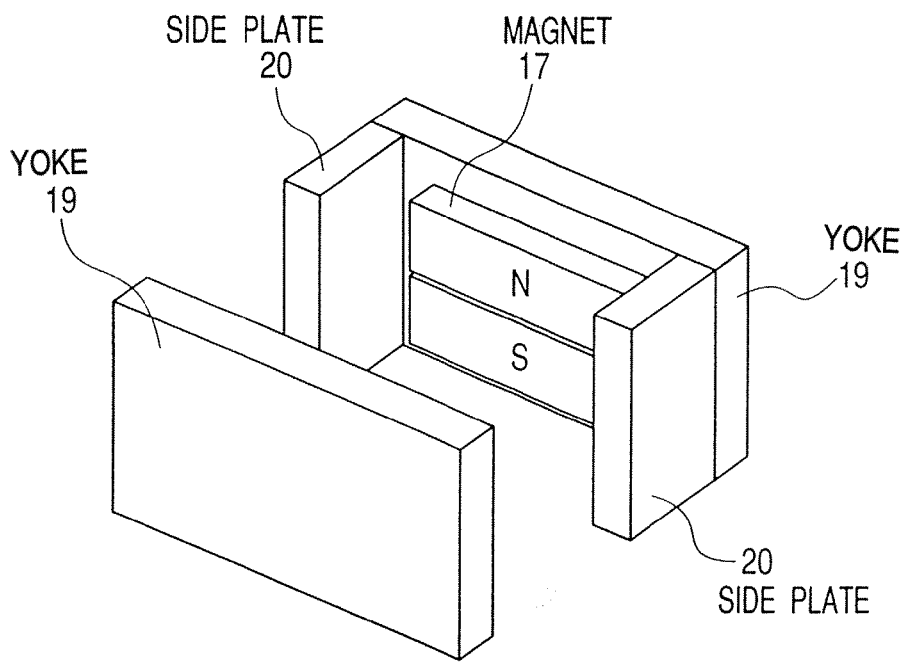
FIG. 4 shows the details of the moving member of first Example.

Of seven moving members 3, three moving members 9a, 9b and 9c form Z moving members for micro-driving the moving table 1 in the Z direction with respect to the fixed table 2. In the Z moving members 9a, 9b and 9c, the bipolar magnets 17 are arranged along the Z direction as shown in FIG. 4, and interact with currents passing through elliptical coils of Z fixed members 14a, 14b and 14c each having a straight line portion perpendicular to the Z direction as described later to produce thrust forces in the Z direction.

Of the remaining four moving members, two moving members form X moving members 10a and 10b for micro-driving the moving table 1 in the X direction with respect to the fixed table 2. In the X moving members 10a and 10b, the bipolar (N-pole and S-pole) magnets 17 are arranged along the X direction, and interact with currents passing through elliptical coils of X fixed members 15a and 15b each having a straight line portion perpendicular to the X direction as described later to produce thrust forces in the X direction.

The remaining two moving members form Y moving members 13a and 13b for micro-driving the moving table 1 in the Y direction with respect to the fixed table 2. In the Y moving members 13a and 13b, the bipolar magnets 17 are arranged along the Y direction, and interact currents passing through elliptical coils of Y fixed members 16a and 16b each having a straight line portion perpendicular to the Y direction as described later to produce thrust forces in the Y direction.

Furthermore, two linear motor actuators in X and Y directions, respectively, have been described, but there may be one actuator as one of these linear motor actuators as described above.

A spring 21 for bearing the tare weight of the moving table 1 is placed between the centers of the moving table 1 and the fixed table 2 to alleviate the thrust force of the linear motor in the Z direction and as a result, heat generation of the motor can be inhibited. The tare compensation spring 21 is designed to have very small spring constants in a rare bearing direction and other five degree-of-freedom directions (i.e. all six degree-of-freedom directions), so that transfer of vibrations from the fixed table 2 through the spring 21 to the moving table 1 is almost negligible. In this Example, only one tare compensation spring 21 is placed between the moving table 1 and the fixed table 2, but a plurality of tare compensation springs may be used to bear the tare weight in a distributed manner. Furthermore, the tare compensation means is not necessarily the coil spring shown in the figure, but may be an element having spring characteristics, a magnetic suction member capable of being provided between the moving table 1 and the fixed table 2 separately from the linear motor to bear the tare weight, or a repulsive magnet. Furthermore, in the case where the tare compensation spring is provided, it is preferably provided outside of a light irradiation area (area upon which exposure light impinges).

The Z coordinates of lines of action of forces produced by X moving members 10a and 10b are almost identical. It is desirable that the Z coordinates of lines of action of forces produced by X moving members 10a and 10b are almost identical to the Z coordinates of centers of gravity of X moving members 10a and 10b, Y moving members 13a and 13b, Z moving members 9a, 9b and 9c, and the moving table 1 (and the optical element 32 if not included in the moving table 1). In this way, owing to thrust forces in the X direction produced in X moving members 10a and 10b, forces of rotation about the Y axis hardly act on the moving table 1. Furthermore, similarly, the Z coordinates of lines of action of forces produced by Y moving members 13a and 13b are almost identical. It is desirable that the Z coordinates of lines of action of forces produced by Y moving members 13a and 13b are almost identical to the Z coordinates of centers of gravity of X moving members 10a and 10b, Y moving members 13a and 13b, Z moving members 9a, 9b and 9c, and the moving table 1 (and the optical element 32 if not included in the moving table 1). In this way, owing to thrust forces in the Y direction produced in Y moving members 13a and 13b, forces of rotation about the X axis hardly act on the moving table 1.

On the other hand, seven micro adjustment linear motor fixed members 4 for positionally controlling the moving table 1 in directions of six axes, and the one end of one or more tare compensation elements for bearing the tare weight of the moving table 1 are fixed on the fixed table 2.

Each fixed member 4 supports an elliptical coil with a coil fixing frame, and faces the linear motor moving member 3 fixed on the back surface of the moving table 1 in a noncontact manner.

Of seven fixed members 4 three fixed members 14a, 14b and 14c form Z fixed members for micro-driving the moving table 1 in the Z direction with respect to the fixed table 2. The Z fixed members 14a, 14b and 14c are arranged so that the straight line portion of the elliptical coil is perpendicular to the Z direction, and thrust forces in the Z direction can be made to act on the bipolar magnets 17 arranged along the Z direction of the Z moving members 9a, 9b and 9c.

Of the remaining four fixed members, two fixed members 15a and 15b form X fixed members. The X fixed members 15a and 15b are arranged so that two straight line portions of the elliptical coil are perpendicular to the X direction and two straight line portions are along the X direction, and thrust forces in the X direction can be made to act on the bipolar magnets 17 arranged along the X direction of the X moving members 10a and 10b. Similarly, the remaining two fixed members 16a and 16b form Y fixed members. The Y fixed members 16a and 16b are arranged so that two straight line portions of the elliptical coil are perpendicular to the Y direction and two straight line portions are along the Y direction, and thrust forces in the Y direction can be made to act on the bipolar magnets 17 arranged along the Y direction of the Y moving members 13a and 13b.

The moving table 1 has a linear sensor or two-dimensional sensor (not shown) for measuring the positions and angles in directions of six axes of the moving table 1. The sensor should effectively act in the moving range of the moving table 1, and may be constituted by, for example, an ultrasonic sensor, optical sensor, laser interferometer or linear scale. A control system for controlling the position and drive of the moving table 1 may be constituted by the sensor and the actuator.

Figure 6:
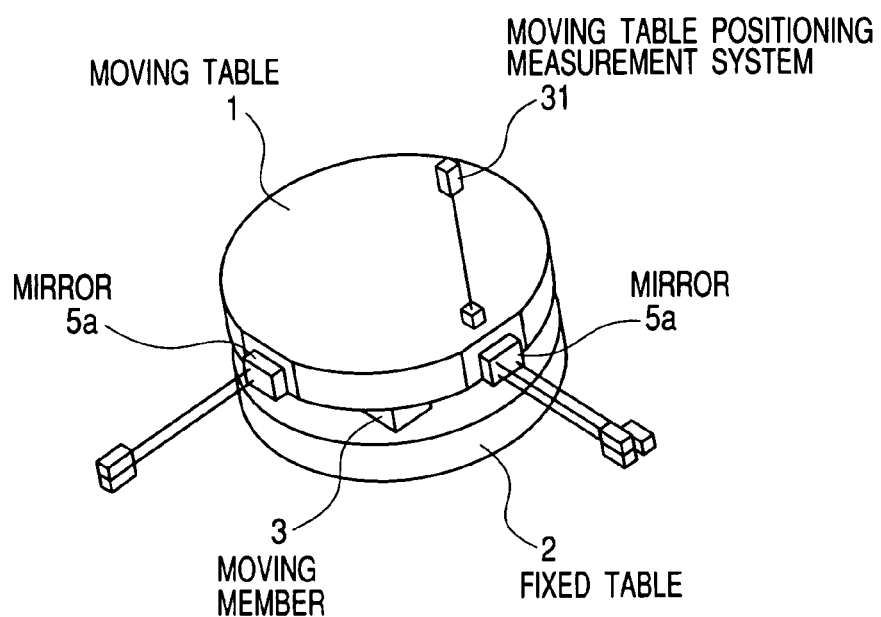
FIG. 6 shows a positioning measurement system of a six-axis micro adjustment mechanism of first Example.

The moving table 1 is provided with a mirror or sensor target 5 for the above measurement means. FIG. 6 shows an example of using the laser interferometer for measurement means for all axes. Specifically, six light beams are applied to the moving table 1 to measure six degree-of-freedom positions of the moving table 1. In the example shown in this figure, the position in the X direction and the amounts of rotation in directions of θy and θz of the moving table 1 can be measured with three interferometer beams parallel to the X axis and different in Z and Y positions. Furthermore, the position in the Y direction and the amount of rotation in the direction of θx can be measured with two interferometer beams parallel to the Y axis and different in Z position. Further, the position in the Z direction can be measured with an interferometer beam parallel to the Z axis. The laser interferometer applying laser light may be provided integrally with the fixed table 2 and the structure frame 24, or may be provided in other vibration-free structure aside from the positioning apparatus. Some specific examples in these cases will be described below.

Figure 10:
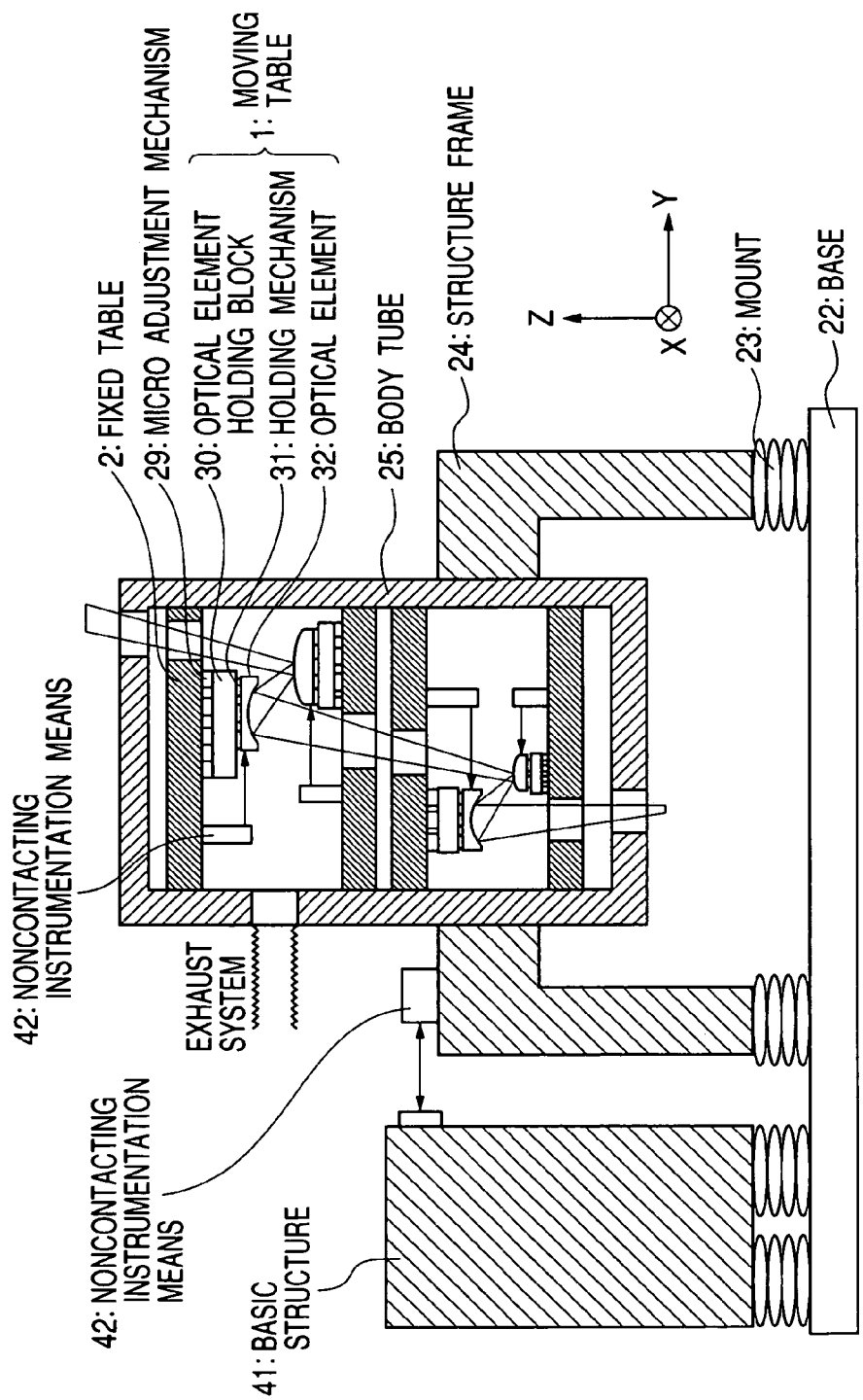
FIG. 10 shows a first alteration example of a positioning measurement method of first Example.

An example of configuration (first alteration example) for measuring and correcting a relative position between the optical element 32 and the wafer or reticle (not shown) is shown in FIG. 10. FIG. 10 shows an example of exposure apparatus, in which an illumination optical system guiding light from a light source to a mask (reticle), a mask stage supporting and driving the mask, and the like are not shown, but a structure supporting a projection optical system guiding light from the mask to the wafer (exposed body), and a structure supporting the projection optical system are shown. (Of course, the same holds true for FIGS. 11 to 14 described below). In this example, postures in directions of six axes of the moving table 1 (particularly optical element 32) are measured in a noncontact manner from measurement means 42 mounted on the fixed table 2 supporting the optical elements 32. The result of this measurement is "local" information of the optical element 32, and thus separate means for measuring and compensating the relative position and angle between the optical element 32 and the wafer or reticle placed on a different structure is required. In the example of FIG. 10, a posture between the structure frame 24 bearing the optical element and a separately provided basic structure 41 is measured separately, the posture of the optical element 32 is controlled with the basic structure as a reference, and the posture relative to the basic structure 41 is corrected for all elements requiring relative postures such as the wafer and reticle, whereby all relative postures can be controlled. This local measurement means 42 and the measurement means 42 between the basic structure 41 and the structure frame 24 may have different principles, and non-contacting instrumentation means such as a laser interferometer or electric capacity sensor is preferably used as described above.

Figure 11:
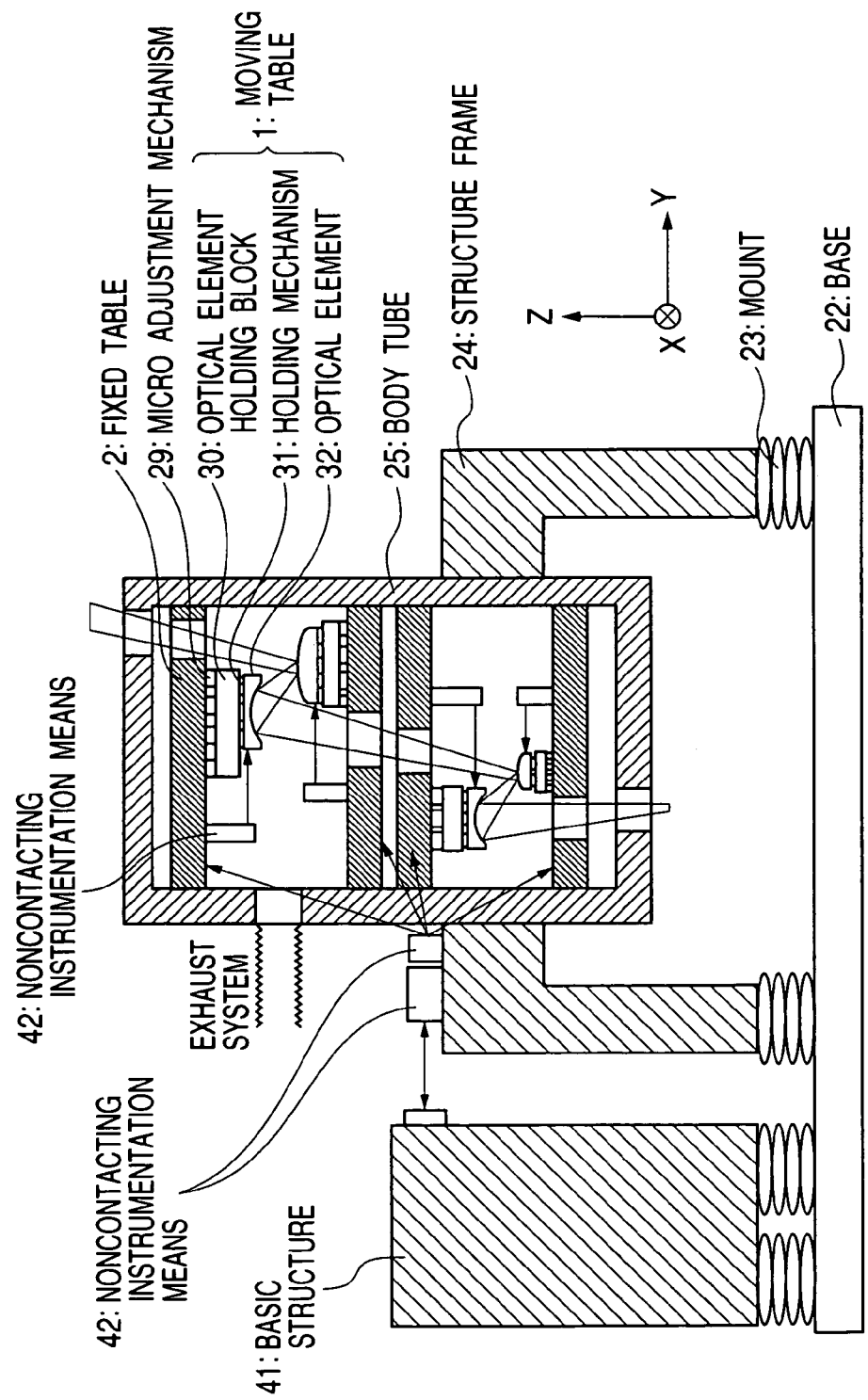
FIG. 11 shows a second alteration example of a positioning measurement method of first Example.

FIG. 11 shows another example of configuration (second alteration example) for measuring and correcting the relative position between the optical element 32 and the wafer or reticle (not shown). In this example, in addition to the means shown in FIG. 10, a variation in posture between the structure frame 24 and each fixed table 2 or local measurement means 42 is measured, and errors caused by deformation of a body tube 25 and the like are corrected. In this way, more accurate relative positioning between the optical element 32 and the wafer, reticle or the like can be performed.

Figure 12:
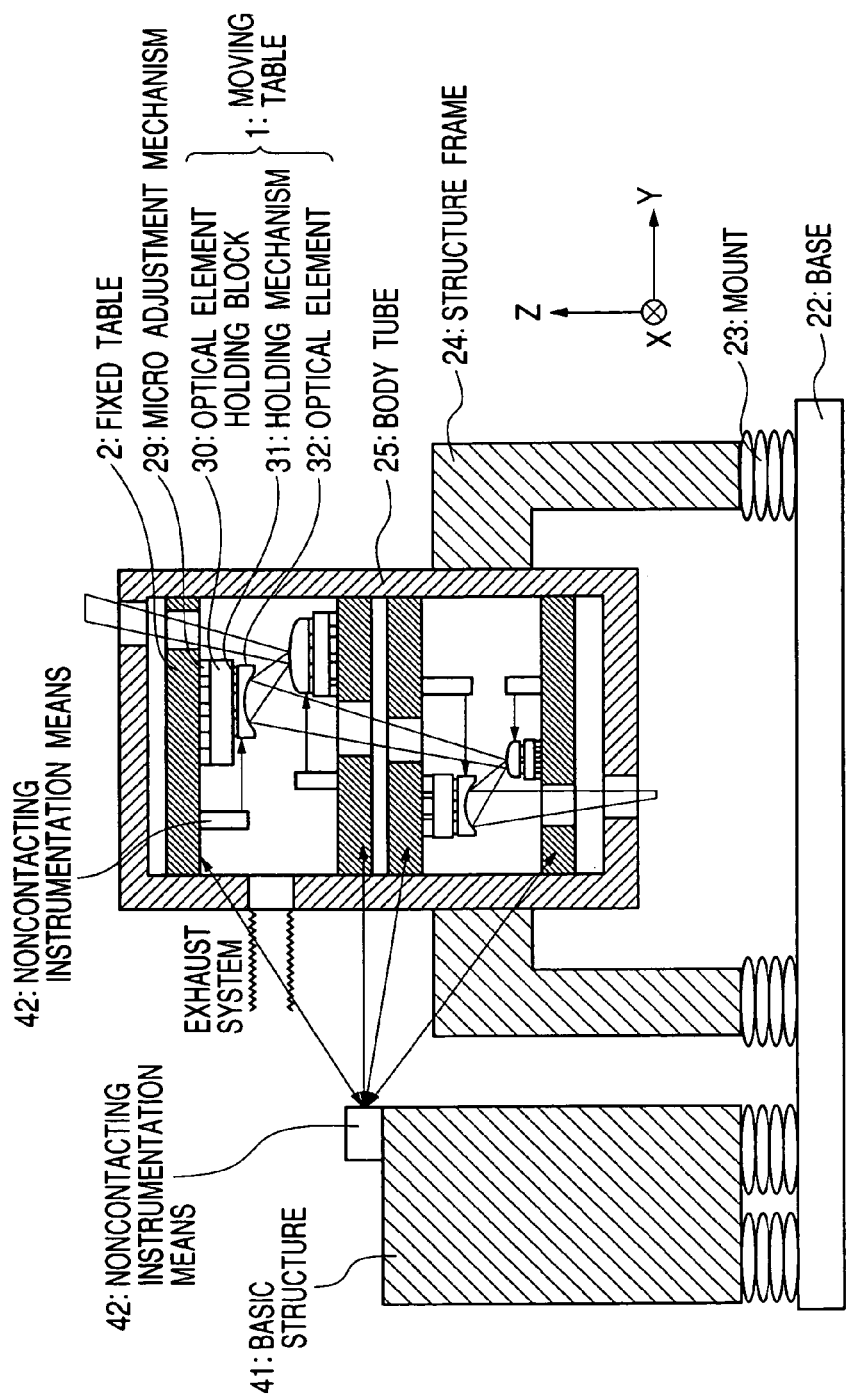
FIG. 12 shows a third alteration example of a positioning measurement method of first Example.

FIG. 12 shows another example of configuration (third alteration example) for measuring and correcting the relative position between the optical element 32 and the wafer or reticle (not shown). In this example, the example described with FIG. 11 is implemented with another configuration. Specifically, a variation in posture between the basic structure 41 and each fixed table 2 or local measurement means 42 is measured by the noncontacting instrumentation means 42 mounted on the basic structure 41, and the posture of the optical element 32 is controlled according to the result combined with the result of local posture measurement.

Figure 13:
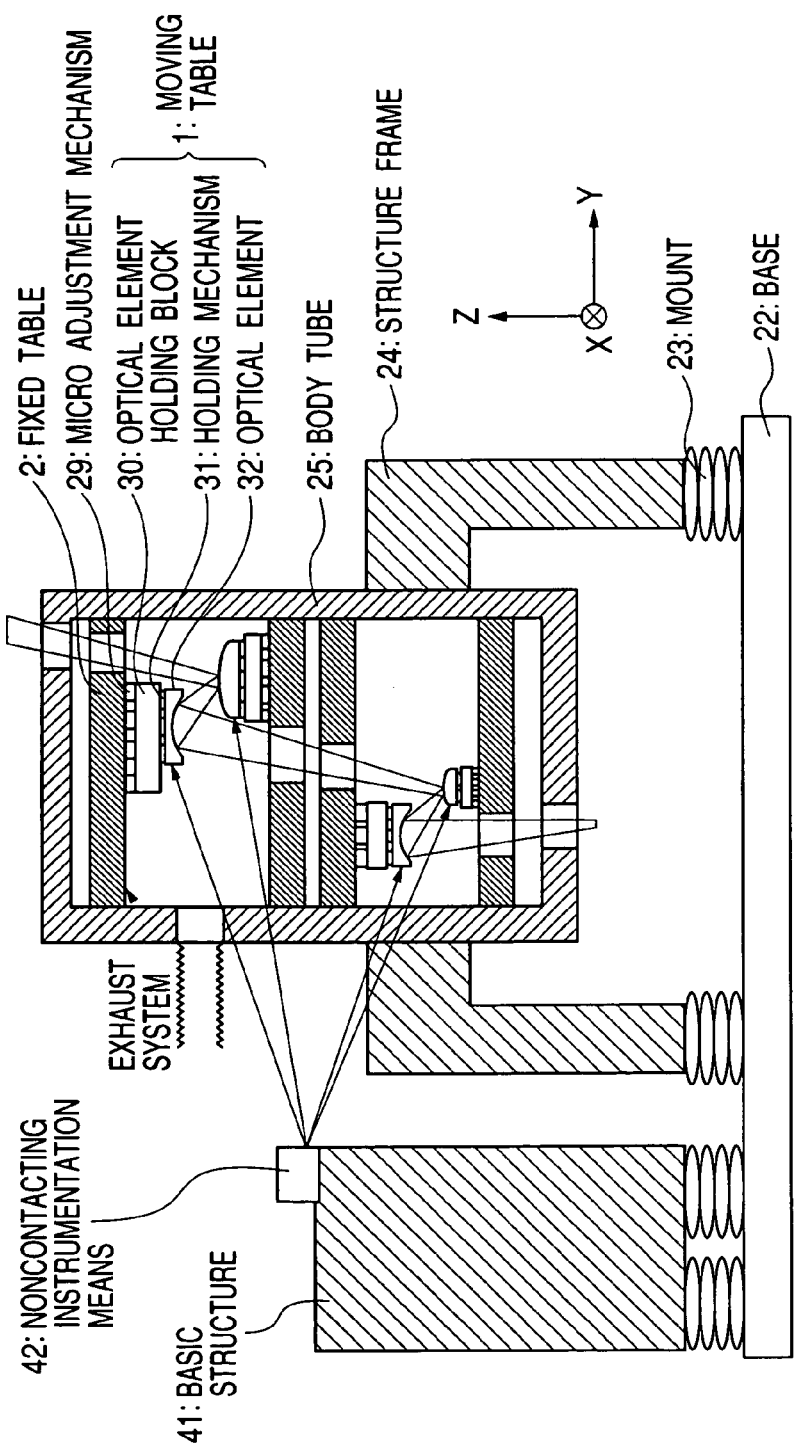
FIG. 13 shows a fourth alteration example of a positioning measurement method of first Example.

FIG. 13 shows another example of configuration (fourth alteration example) for measuring and correcting the relative position between the optical element 32 and the wafer or reticle (not shown). In this example, the example described with FIG. 12 is implemented with another configuration. Specifically, a variation in posture between the basic structure 41 and each optical element 32 is measured by the noncontacting instrumentation means 42 mounted on the basic structure 41, and the posture is controlled. In this way, accurate positioning of the optical element 32 can be performed without carrying out local posture measurement.

Figure 14:
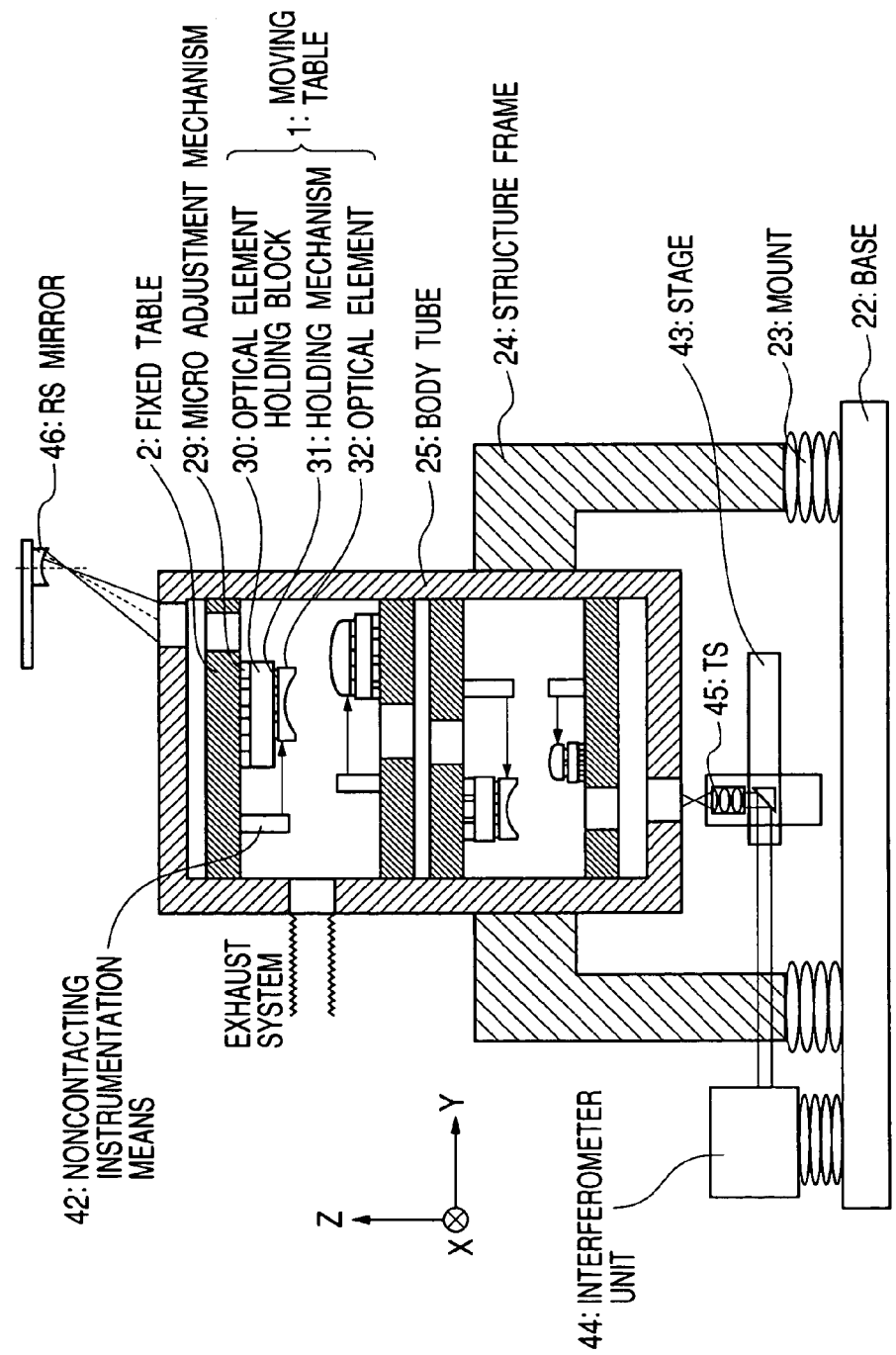
FIG. 14 shows a fifth alteration example of a positioning measurement method of first Example.
Figure 15A:
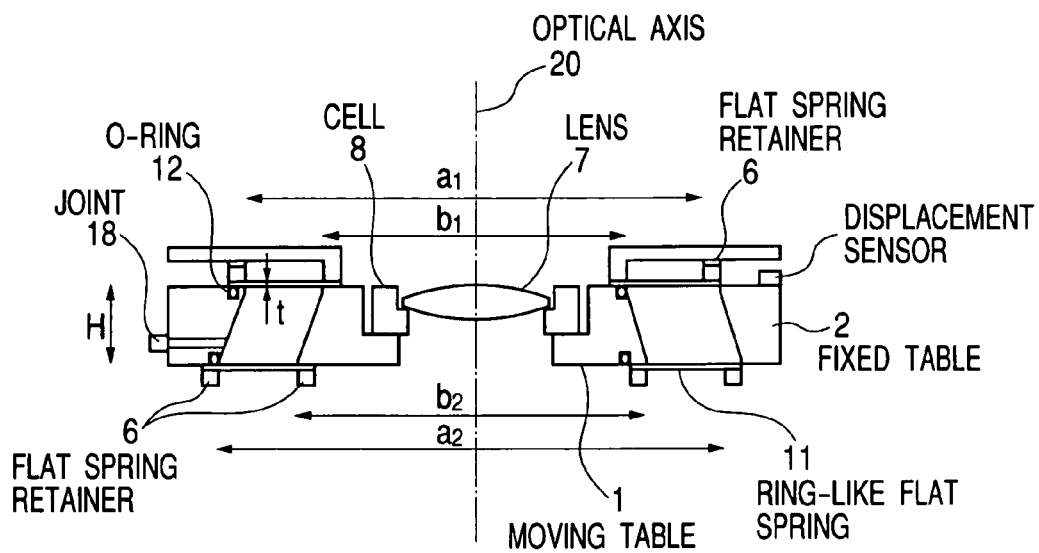
FIGS. 15A and 15B show the details of a conventional flat spring optical element micro adjustment mechanism.
Figure 15B:
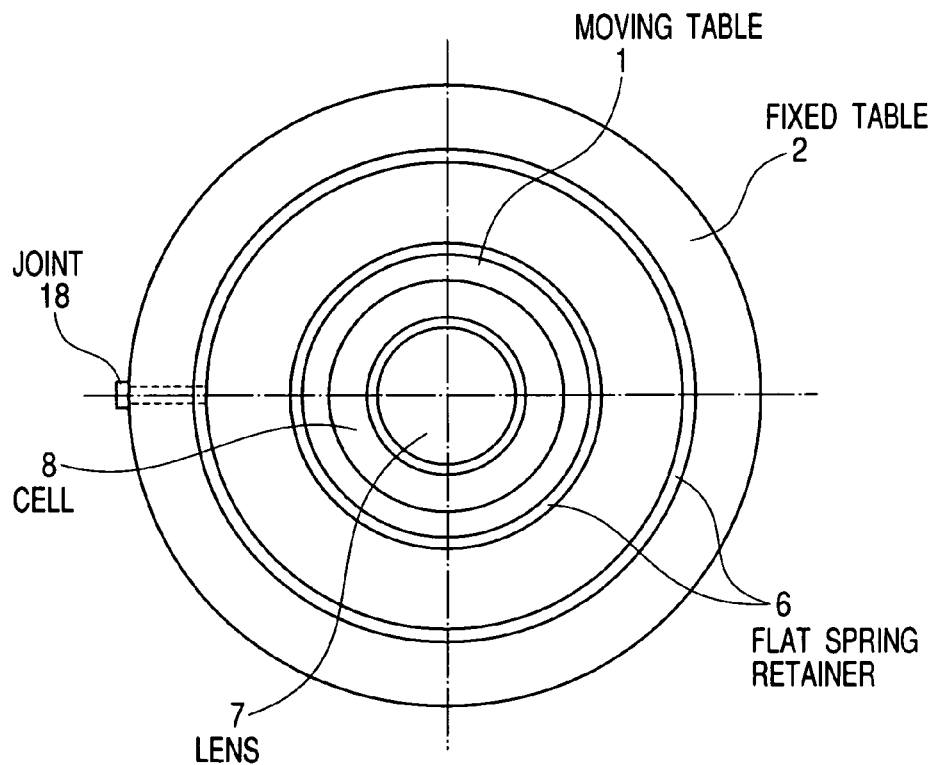

FIG. 14 shows an example of configuration (fifth alteration example) for measuring and correcting the relative position between the optical element 32 and the wafer or reticle (not shown). In this example, a wave shape measurement apparatus incorporated in an exposure apparatus main body is used for measurement of the position of the optical element and the like. One example of configuration for this measurement will be described in detail. Fluxes of light from an interferometer unit 44 are applied to an optical system including a TS 45 provided on a stage. Some of the fluxes of light are returned back to the interferometer unit 44 from the TS 45, and the other fluxes pass via a projection optical system placed in the body tube 25, are reflected by an RS mirror 46 provided on the back surface of the reticle or mask stage, enter the interferometer unit 44 via the projection optical system via the projection optical system and the TS 45 again, and interfere with fluxes of light not passing via the projection optical system via the projection optical system and the like. From the intensity distribution thereof, wave aberrations of the projection optical system can be measured, and the TS 45 and the RS mirror 46 are driven to measure wave aberrations at a plurality of points in an exposure area, whereby the positions and angles of the optical elements 32, the surface of the wafer and the surface of the mask can be calculated. Thus, the positions of the optical element 32 and the like can be corrected using a wave aberrometer. However, such wave aberration measurement means requires special operations other than essential exposure operations, such as an operation of moving the stage to move the measuring optical system to a desired position, and therefore is not always capable of being used from a viewpoint of throughput. Thus, for the constant measurement of the position of each optical element 32, it is recommended that noncontacting instrumentation means 42 provided for each optical element 32 should be used to perform position control, and the noncontacting instrumentation means 42 should be calibrated from the result by the wave aberration measurement means at appropriate intervals of, for example, several hours or several days.

Due to the noncontact measurement and drive configuration described above, vibration disturbances and the like from parts other than the moving table 1 can be blocked to realize accurate positioning of the optical element 32.

SECOND EXAMPLE

Figure 7:
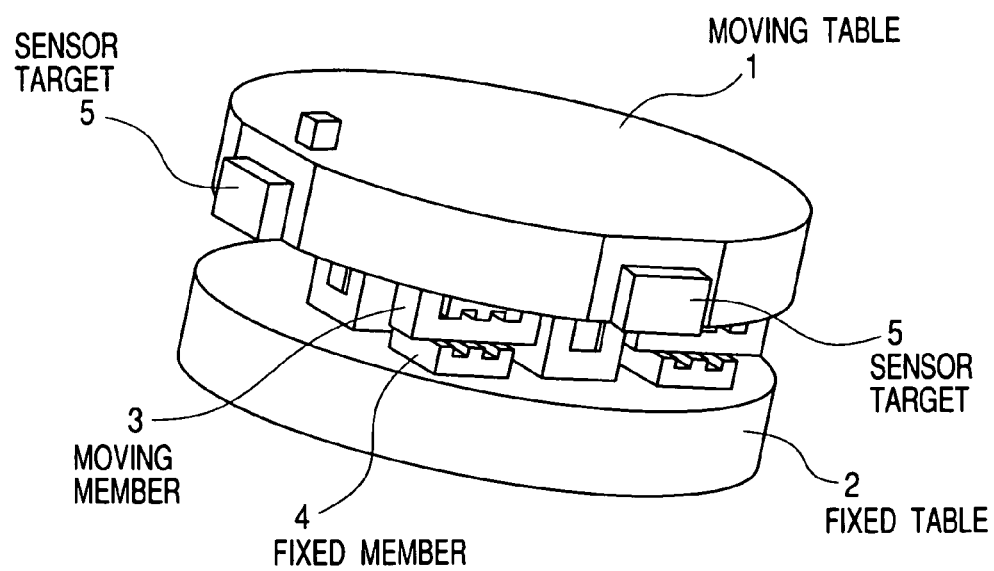
FIG. 7 shows an electromagnet-type optical element micro adjustment mechanism of second Example.

FIGS. 7 and 5 are schematic illustrations of the second embodiment of the present invention. This Example is an embodiment of realizing the linear motor with a suction force or repulsive force of an electromagnet, and the details thereof will be described below focusing on the example with the suction force of the electromagnet. This allows a moving table 1 to move in directions of six axes with respect to a fixed table 2 in a noncontact manner. Here, the directions of six axes refer to X, Y and Z directions and directions of rotation about X, Y and Z axes.

The moving table 1 is a mirror or lens being an optical element 32. Alternatively, the moving table 1 may include a holding member or the like for supporting the mirror or lens.

An actuator is a driving mechanism for driving the moving table 1 with respect to the fixed table 2. Here, the actuator has X actuators for driving the moving table 1 in the X direction, Y actuators for driving the moving table 1 in the Y direction, and Z actuators for driving the moving table 1 in the Z direction. A plurality of actuators are provided as at least one of the X actuator and the Y actuator. Here, if there are two Y actuators, for example, use of these Y actuators allows the moving table 1 to be driven not only in the Y direction but also in the direction of rotation (θ) about the Z axis. Furthermore, at least three Z actuators are provided. These three or more Z actuators allow a micro adjustment stage to be driven not only in the Z direction but also in the inclination direction (directions of rotation about X and Y axes).

The actuator by an electromagnet is constituted by an electromagnet and a suction plate or permanent magnet. In this Example, an electromagnet is attached to one of the moving table 1 and the fixed table 2, and a magnetic body or permanent magnet is attached to the other, and they are used as a moving member 3 and a fixed member 4, respectively. Use of the suction force of the magnet is more preferable than use of the repulsive force in that the degree of freedom for selection of materials is ensured, and the electric power required for driving is low. Furthermore, it is desirable that the electromagnet is provided on the fixed member 4 side, i.e. the fixed member 4 is provided on the fixed table 2, and the magnetic material or permanent magnet is provided as the moving member 3, i.e. the moving member 3 is provided on the moving table 1 for convenience in wiring and the like. The embodiment will be described below focusing on the driving by the suction force of the electromagnet.

Figure 8:
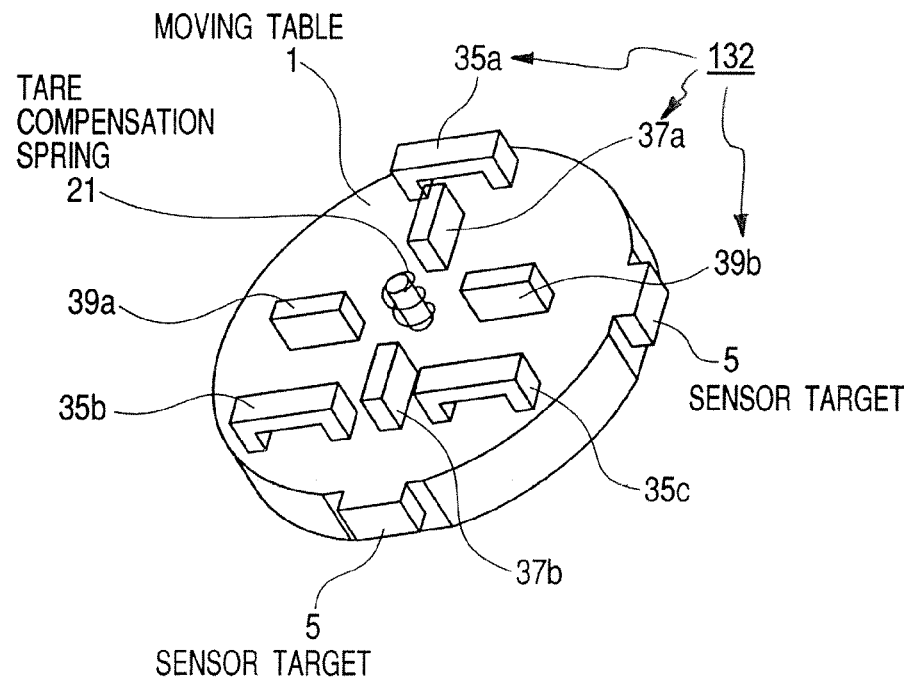
FIG. 8 shows a layout of the moving member on the moving table of second Example.
Figure 9:
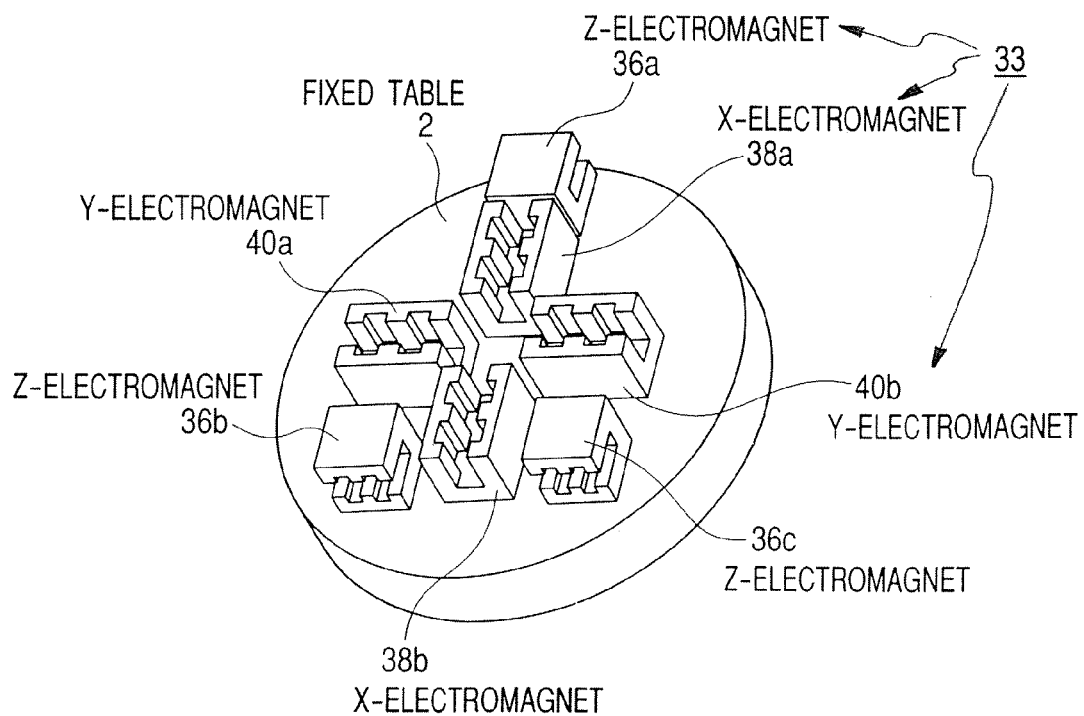
FIG. 9 shows a layout of the fixed member on the fixed table of second Example.

FIGS. 8 and 9 are perspective views of the moving table 1 and the fixed table 2, respectively. Seven magnetic blocks 132 (35a–c, 37a–b, 39a–b) are mounted on the back surface of the moving table 1. Each magnetic block 132 is oppositely fixed by a pair of electromagnets 33 (36a–c, 38a–b, 40a–b) described later on with the magnetic block 132 sandwiched therebetween in a noncontact manner.

On the other hand, the electromagnet 33 is fixed on the fixed table 2 side. The electromagnet 33 comprises a magnetic block 34 (not shown) having an E-type cross section and a coil (not shown). The coil is wound around an E-type central raised portion. Two E-type electromagnets 33 are combined as a pair, and each pair is fixed oppositely to the magnetic block 32 mounted on the moving table 1 side with a small gap from the end faces of three E-type raised portions of the electromagnet 33.

Each electromagnet can produce only a suction force, and therefore an electromagnet producing a suction force in the+direction and an electromagnet producing a suction force in the–direction, for each of XY and Z driving directions, should be combined as a pair. By passing a current through the coil of one of a pair of electromagnets 33, a suction force acts on the magnetic block 32 from the electromagnet 33, and thus this force may be used as a thrust force of the actuator, but currents are passed through the coils of both electromagnets 33, and a difference therebetween may be used as a thrust force of the actuator.

Three magnetic blocks 35a, 35b and 35c of seven magnetic blocks 32 on the moving table side form Z moving members for micro-driving the moving table 1 in the Z direction with respect to the fixed table 2. The Z direction magnetic blocks 35a, 35b and 35c have suction surfaces perpendicular to the Z direction as shown in FIG. 8, and suction forces by Z electromagnets 36a, 36b and 36c having E-type raised faces arranged perpendicularly to the Z direction as described later are adjusted for each pair to produce thrust forces in the Z direction. Furthermore, preferably, these three Z direction magnetic blocks 35a, 35b and 35c are (made to match the center of gravity of a triangle formed by the three points) so as to surround the totalized center of gravity of moving parts.

Of the remaining four magnetic blocks 32 (35, 37, 39) on the moving table side, two magnetic blocks 37a and 37b on the moving table side form X magnetic blocks 37a and 37b for micro-driving the moving table 1 in the X direction with respect to the fixed table 2. The X direction magnetic blocks 37a and 37b have suction surfaces perpendicular to the X direction as shown in FIG. 8, and suction forces by X electromagnets 38a and 38b having E-type raised faces arranged perpendicularly to the X direction are adjusted for each pair to produce thrust forces in the X direction. Similarly, the remaining two magnetic block 39a and 39b on the moving table side form Y side magnetic blocks. The Y direction magnetic blocks 39a and 39b have suction surfaces perpendicular to the Y direction, and suction forces by Y electromagnets 40a and 40b having E-type raised faces arranged perpendicularly to the Y direction are adjusted for each pair to produce thrust forces in the Y direction.

Furthermore, two pairs of electromagnet actuators for each of the X direction and the Y direction have been described, but a pair of actuators may be used for one of the X direction and the Y direction.

The magnetic blocks 32 (35, 37, 39) on the fixed table side, and the magnetic blocks 34 of the E-type electromagnets 33 (36, 38, 40) on the moving table side may be formed by stacking thin plates with layers mutually electrically insulated. For the layered plate, a silicon steel plate is well known. In this way, passage of an eddy current into the block with a change in magnetic flux is prevented, the suction force of the E-type electromagnet 34 can be controlled up to a high frequency, applications requiring high-speed operations can be coped with, and also the control band is improved, thus making it possible to obtain an enhanced vibration prevention effect.

A spring 21 for bearing the tare weight of the moving table 1 is placed between the centers of the moving table 1 and the fixed table 2 to alleviate the thrust force of the linear motor in the Z direction and as a result, heat generation of the motor can be inhibited. The tare compensation spring 21 is designed to have very small spring constants in a rare bearing direction and other five degree-of-freedom directions, so that transfer of vibrations from the fixed table 2 through the spring 21 to the moving table 1 is almost negligible. In this Example, only one tare compensation spring 21 is placed between the moving table 1 and the fixed table 2, but a plurality of tare compensation springs may be used to bear the tare weight in a distributed manner. Furthermore, the tare compensation means is not necessarily the coil spring shown in the figure, but may be an element having spring characteristics, a magnetic suction member capable of being provided between the moving table 1 and the fixed table 2 separately from the linear motor to bear the tare weight, or a repulsive magnet.

The Z coordinates of lines of action of forces produced by X magnetic blocks 37a and 37b are almost identical. It is desirable that the Z coordinates of lines of action of forces produced by X magnetic blocks 37a and 37b are almost identical to the Z coordinates of centers of gravity of X magnetic blocks 37a and 37b, Y magnetic blocks 39a and 39b, Z magnetic blocks 35a, 35b and 35c, and the moving table 1 (and the optical element 32 if not included in the moving table 1). Thus, owing to thrust forces in the X direction produced in X magnetic blocks 37a and 37b, forces of rotation about the Y axis hardly action the moving table 1.

The Z coordinates of lines of action of forces produced by Y magnetic blocks 39a and 39b are almost identical. It is desirable that the Z coordinates of lines of action of forces produced by Y magnetic blocks 39a and 39b are almost identical to the Z coordinates of centers of gravity of X magnetic blocks 37a and 37b, Y magnetic blocks 39a and 39b, Z magnetic blocks 35a, 35b and 35c, and the moving table 1 (and the optical element 32 if not included in the moving table 1). In this way, owing to thrust forces in the Y direction produced in Y magnetic blocks 39a and 39b, forces of rotation about the X axis hardly act on the moving table 1.

On the other hand, the fixed members 4 of seven electromagnet actuators for positionally controlling the moving table 1 in directions of six axes, and the one end of one or more tare compensation elements for bearing the tare weight of the moving table 1 are fixed on the fixed table 2.

Each electromagnet 33 has a coil wound around a pair of magnetic blocks 34 having E-type cross sections as described previously, and faces the magnetic block 32 fixed on the back surface of the moving table 1 described previously with the magnetic block 32 sandwiched between electromagnets 33 in a noncontact manner.

The moving table 1 has a linear sensor or two-dimensional sensor (not shown) for measuring the positions and angles in directions of six axes of the moving table 1. The sensor should effectively act in the moving range of the moving table 1, and may be constituted by, for example, an ultrasonic sensor, optical sensor, laser interferometer or linear scale. A control system for controlling the position and drive of the moving table 1 may be constituted by the sensor and the actuator.

The moving table 1 is provided with a mirror or sensor target 5 for the above measurement means. FIG. 6 shows an example of using the laser interferometer for measurement means for all axes. Specifically, six light beams are applied to the moving table 1 to measure six degree-of-freedom positions of the moving table 1. In the example shown in this figure, the position in the X direction and the amounts of rotation in directions of θy and θz of the moving table 1 can be measured with three interferometer beams parallel to the X axis and different in Z and Y positions. Furthermore, the position in the Y direction and the amount of rotation in the direction of θx can be measured with two interferometer beams parallel to the Y axis and different in Z position. Further, the position in the Z direction can be measured with an interferometer beam parallel to the Z axis. The laser interferometer applying laser light may be provided integrally with the fixed table 2 and the structure frame 24, or may be provided in other vibration-free structure aside from the positioning apparatus. A specific measurement method may be same as that described in Example 1.

The driving mechanism driving the optical element or the moving body supporting the optical element, and the exposure apparatus using the driving mechanism have been described. The exposure apparatus in this Example is such that EUV light (wavelength of 13 nm to 14 nm) is mainly used, and the optical path and the optical system extending from the light source to a body to be exposed is almost all kept under vacuum, and similarly the optical element in this apparatus is preferably a reflection member provided on the surface with a multi-layer film having a plurality of stacked Mo films and Si films (or Mo films and Be films) reflecting EUV light in a reflectance ratio of 60% or greater.

Furthermore, if the electromagnet or the like is used, the problem arises such that heat is inevitably generated, while the optical element absorbs light to generate heat, and therefore cooling means capable of cooling the electromagnet and the optical element at the same time, preferably radiation cooling means cooling them with radiation is provided.

In first and second examples, the positioning mechanism and exposure apparatus driving a mirror and a member supporting the mirror in directions of six axes using a linear motor have been described. In third and subsequent Examples described below, methods for driving the mirror using the linear motor to position the mirror with high accuracy, and structures therefor will be described in detail. Thus, first and second examples and third to eighth Examples may be combined to the extent that they are mutually contradictory, or each of Examples of the present invention may be considered as an invention by itself.

THIRD EXAMPLE

The exposure apparatus and the optical element positioning apparatus of the present invention will be described using FIG. 16.

The exposure apparatus shown in FIG. 16 comprises an illumination optical system 52 guiding light from a light source 53 emitting EUV light (wavelength of 10 to 15 nm) to an original plate to uniformly illuminate the original plate, a reticle stage 51 holding the original plate (mask or reticle, etc.) illuminated by the illumination optical system, a projection optical system 55 guiding light from the original plate to a substrate, a wafer stage 27 holding the substrate (wafer, etc.), and the like.

Furthermore, this exposure apparatus has a basic structure 41, and the reticle stage 51 is controlled to be positioned in directions of six axes with respect to the basic structure 41. The directions of six axes here refer to (translational directions of) directions of X, Y and Z axes, and directions of rotation about X, Y and Z axes.

The projection optical system 55 supports a plurality of optical elements 32 (they are all mirrors in FIG. 16, but lenses and diffractive optical elements may be included) via an optical element micro adjustment mechanism 61 described later.

The wafer stage 27 is situated so that the surface bearing the wafer 28 intersects the direction of the optical axis of the projection optical system 55. Patterns on the original plate (mask or reticle) irradiated with exposure light are projection-transferred to the wafer 28 on the wafer stage 27 with the patterns scaled down by a predetermined scaling factor via the projection optical system via the projection optical system 55. The wafer stage 27 is controlled to be positioned in directions of six axes with respect to the basic structure 41.

The optical element micro adjustment mechanism 61 of the projection optical system 55 will now be described. The optical element micro adjustment mechanism 61 is comprised of noncontacting instrumentation means 42 measuring the position of a moving part 1 with respect to the basic structure 41 in a noncontact manner, a driving mechanism 29 for driving the moving part 1, and a compensator (not shown) a command value to the driving mechanism 29 based on measurement information of the noncontacting instrumentation means 42. Here, a PID compensator is used as the compensator (control system other than PID may be incorporated as a matter of course). The optical element micro adjustment mechanism 61 controls the moving part 1 to be positioned in directions of six axes with respect to the basic structure 41, based on measurement information of the noncontacting instrumentation means 42. The moving part 1 includes the optical element 32 (lens or mirror), or a holding mechanism 31 and an optical element holding block 30 for holding the optical element 32 in addition to the optical element 32 in FIG. 16, but the moving part 1 may include only the optical element 32 as long as there is no problem in terms of accuracy.

As the driving mechanism 29 capable of driving the moving part 1 in directions of six axes with respect to a fixed part 2, a parallel link mechanism and a six-axis micro adjustment mechanism using an actuator can be considered. As the actuator, a linear motor and a piezoelectric element may be used. In particular, a six-axis micro adjustment mechanism using a linear motor as the actuator can drive the moving part 1 with respect to the fixed part 2 in a noncontact manner, and is therefore excellent in vibration insulation. Here, use of the six-axis micro adjustment mechanism using the linear motor as the driving mechanism 29 of the optical element micro adjustment mechanism 61 will be described.

The linear motor is comprised of X linear motors for driving the moving part 1 in the direction of the X axis, Y linear motors for driving the moving part 1 in the Y direction, and Z linear motors for driving the moving part 1 in the Z direction. A plurality of actuators are provided as at least one of the X linear motor and the Y linear motor. Here, if there are two Y linear motors, for example, use of these Y linear motors allows the moving part 1 to be driven not only in the Y direction but also in the direction of rotation (θ) about the Z axis. Furthermore, at least three Z linear motors are provided. These three or more Z linear motors allow a micro adjustment stage to be driven not only in the Z direction but also in the inclination direction (directions of rotation about X and Y axes).

It is desirable that a coil being a fixed member of a linear motor is provided on the fixed part side and a permanent magnet being a moving member is provided on the moving part side in consideration of convenience in wiring and the like.

Furthermore, since it is expected that heat is generated from the linear motor, a cooling mechanism is provided in the linear motor, whereby generated heat can be inhibited from leaking to outside the actuator. For one example of the cooling mechanism, the coil is covered with a jacket, and a cooling liquid is supplied into the jacket to cool the coil.

Figure 17:
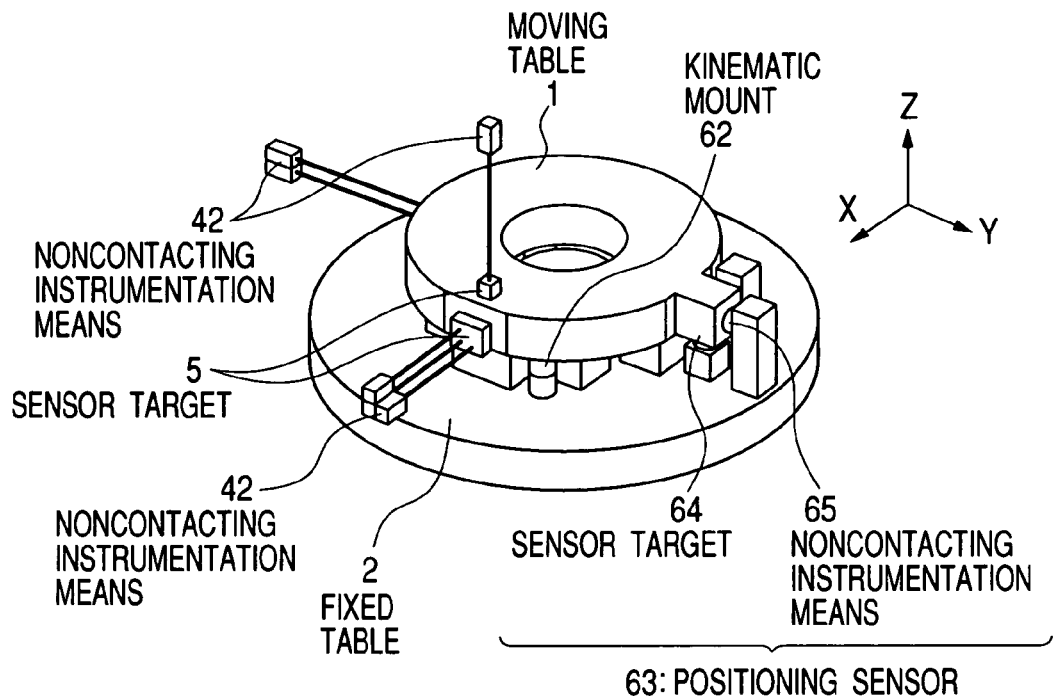
FIG. 17 shows an optical element positioning apparatus.

The details of the optical element micro adjustment mechanism 61 using the linear motor will be described in detail below. An outline of the optical element micro adjustment mechanism 61 is shown in FIG. 17.

Figure 18:
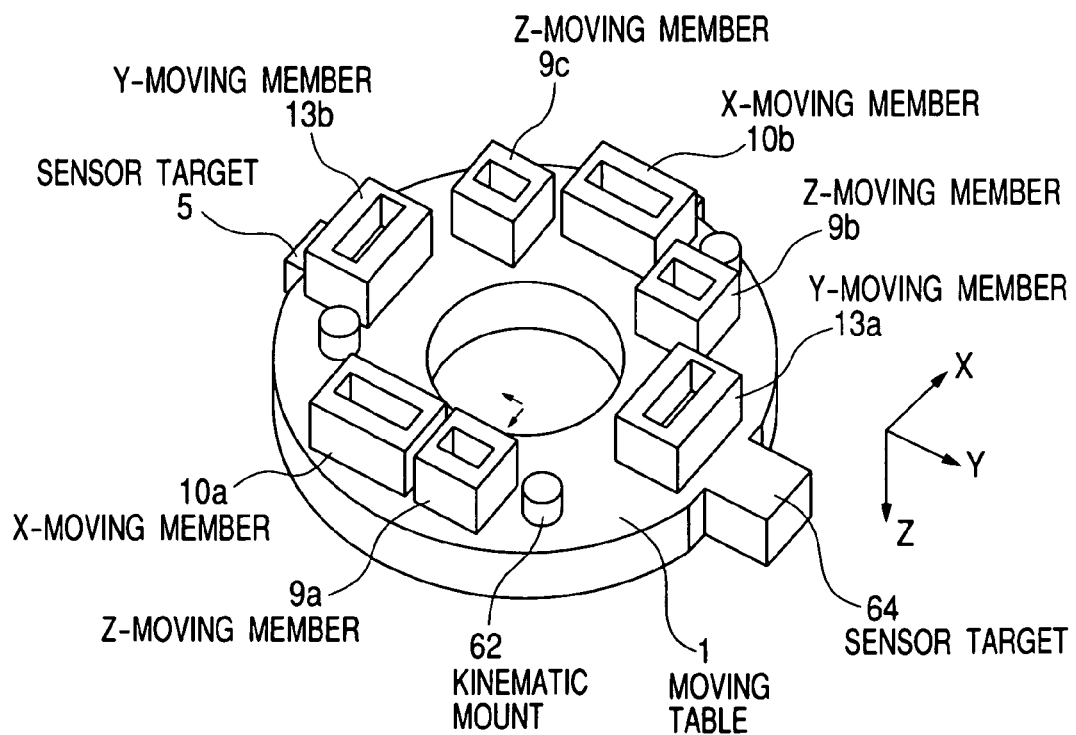
FIG. 18 shows a moving part.

The moving part 1 is provided with moving members 3 (e.g., FIG. 1) constituting the linear motor. In FIG. 18, all the moving members are provided on the back surface of the moving part 1, but some or all of the moving members may be provided on the side face or the like of the moving part 1.

Figure 19:
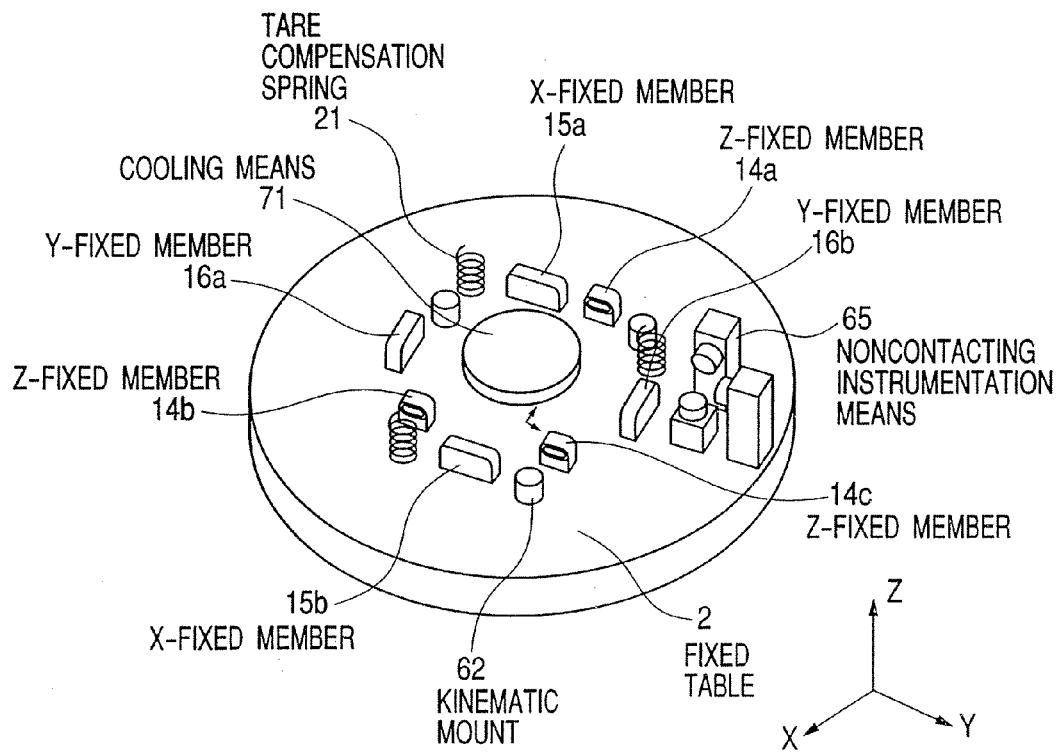
FIG. 19 shows a fixed part.

On the other hand, the fixed part 2 is provided with fixed members constituting the linear motor (see FIG. 19).

The mounting of the linear motor will be described in detail with reference to the perspective views of the moving part 1 and the fixed part 2 shown in FIGS. 18 and 19, respectively.

The moving part 1 is provided on the back surface with seven moving members of the linear motor (not limited to seven moving members, but may be any number moving members allowing the optical element to be driven in directions of six axes). Each moving member has two pairs of bipolar magnets 17 polarized in the direction of thickness and yokes 19 (members forming a closed magnetic path) (see FIG. 20). The two pairs of magnets 17 and yokes 19 are coupled together at a side plate 20 to form a box-like structure, and face each other in such a manner as to sandwich therebetween a micro adjustment linear motor fixed member described later in a noncontact manner.

Figure 20:
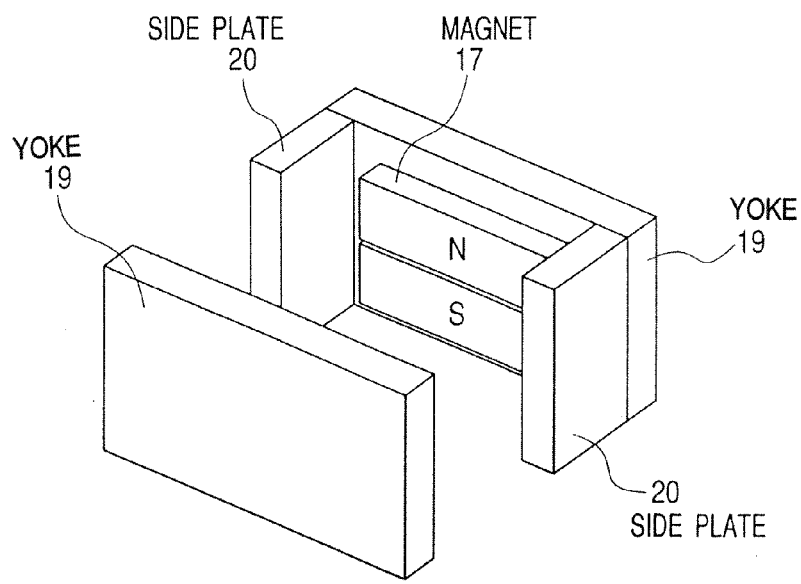
FIG. 20 shows the details of the moving member.

Of seven moving members, three moving members 9a, 9b and 9c form Z moving members for micro-driving the moving part 1 in the Z direction with respect to the fixed part 2. In the Z moving members 9a, 9b and 9c, the bipolar magnets 17 are arranged along the Z direction as shown in FIG. 20, and interact with currents passing through elliptical coils of Z fixed members 14a, 14b and 14c each having a straight line portion perpendicular to the Z direction as described later to produce thrust forces in the Z direction. Here, the elliptical coil refers to a coil having a straight line portion perpendicular to the Z direction, and the coil is not limited to an elliptical coil, but may have any shape as long as it has a straight line portion perpendicular to the direction of the Z axis. Furthermore, the Z moving members 9a, 9b and 9c are arranged so that they are not situated on one straight line, but a triangle is formed by the moving members 9a, 9b and 9c.

Of the remaining four moving members, two moving members form X moving members 10a and 10b for micro-driving the moving part 1 in the X direction with respect to the fixed part 2. In the X moving members 10a and 10b, the bipolar magnets 17 are arranged along the X direction, and interact with currents passing through elliptical coils of X fixed members 15a and 15b each having a straight line portion perpendicular to the X direction as described later to produce thrust forces in the X direction. Here, the elliptical coil refers to a coil having a straight line portion perpendicular to the X direction, and the coil is not limited to an elliptical coil, but may have any shape as long as it has a straight line portion perpendicular to the direction of the X axis.

The remaining two moving members form Y moving members 13a and 13b for micro-driving the moving part 1 in the Y direction with respect to the fixed part 2. In the Y moving members 13a and 13b, the bipolar magnets 17 are arranged along the Y direction, and interact currents passing through elliptical coils of Y fixed members 16a and 16b each having a straight line portion perpendicular to the Y direction as described later to produce thrust forces in the Y direction. Here, the elliptical coil refers to a coil having a straight line portion perpendicular to the Y direction, and the coil is not limited to an elliptical coil, but may have any shape as long as it has a straight line portion perpendicular to the direction of the Y axis.

Furthermore, two linear motor actuators in X and Y directions, respectively, have been described, but there may be one actuator as one of these linear motor actuators as described above.

Springs 21 for bearing the tare weight of the moving part 1 are placed in the moving part 1 and the fixed part 2, respectively, (a tare compensation spring may be placed in only one of the moving part 1 and the fixed part 2), to alleviate the thrust force of the linear motor in the Z direction and as a result, heat generation of the motor can be inhibited. The tare compensation spring 21 is designed to have very small spring constants in a rare bearing direction and other five degree-of-freedom directions (from a relative point of view, a spring constant in the direction of the tare weight of the mirror is preferably larger than other spring constants in other five degree-of-freedom directions), so that transfer of vibrations from the fixed part 2 through the tare compensation spring 21 to the moving part 1 is almost negligible. In this Example, three tare compensation springs 21 are placed between the moving part 1 and the fixed part 2, but any other number of tare compensation springs 21 may be used to bear the tare weight, although three or more tare compensation springs 21 are preferably placed. Furthermore, for the tare compensation means, not only the coil spring shown in FIG. 19, but also other elements having spring characteristics, or three or more pairs of magnets having mutually repulsive polarities may be placed.

The Z coordinates and Y coordinates of lines of action of forces produced by X moving members 10a and 10b are almost identical. It is desirable that the Z coordinates of lines of action of forces produced by X moving members 10a and 10b are almost identical to the Z coordinates and Y coordinates of centers of gravity of the moving part 1 including X moving members 10a and 10b, Y moving members 13a and 13b, and Z moving members 9a, 9b and 9c (and the optical element 32 if not included in the moving part 1). In this way, owing to thrust forces in the X direction produced in X moving members 10a and 10b, forces of rotation about the Y axis and Z axis hardly act on the moving part 1.

As in the case of X moving members, the Z coordinates and X coordinates of lines of action of forces produced by Y moving members 13a and 13b are almost identical. It is desirable that the Z coordinates of lines of action of forces produced by Y moving members 13a and 13b are almost identical to the Z coordinates and X coordinates of centers of gravity of the moving part 1 including X moving members 10a and 10b, Y moving members 13a and 13b, and Z moving members 9a, 9b and 9c (and the optical element 32 if not included in the moving part 1). In this way, owing to thrust forces in the Y direction produced in Y moving members 13a and 13b, forces of rotation about the X axis and Z axis hardly act on the moving part 1.

On the other hand, seven linear motor fixed members for positionally controlling the moving part 1 in directions of six axes, and the one end of one or more tare compensation springs 21 for bearing the tare weight of the moving part 1 are fixed on the fixed part 2.

Each fixed member supports an elliptical coil with a coil fixing frame, and faces the linear motor moving member fixed on the back surface of the moving part 1 in a noncontact manner.

Of seven fixed members, three fixed members 14a, 14b and 14c form Z fixed members for micro-driving the moving table 1 in the Z direction with respect to the fixed table 2. The Z fixed members 14a, 14b and 14c are arranged so that the straight line portion of the elliptical coil is perpendicular to the Z direction, and thrust forces in the Z direction can be made to act on the bipolar magnets 17 arranged along the Z direction of the Z moving members 9*a*, 9*b* and 9*c*.

Of the remaining four fixed members, two fixed members 15*a* and 15*b* form X fixed members. The X fixed members 15*a* and 15*b* are arranged so that two straight line portions of the elliptical coil are perpendicular to the X direction and two straight line portions are along the X direction, and thrust forces in the X direction can be made to act on the bipolar magnets 17 arranged along the X direction of the X moving members 10*a* and 10*b*.

The remaining two fixed members 16*a* and 16*b* form Y fixed members. The Y fixed members 16*a* and 16*b* are arranged so that two straight line portions of the elliptical coil are perpendicular to the Y direction and two straight line portions are along the Y direction, and thrust forces in the Y direction can be made to act on the bipolar magnets 17 arranged along the Y direction of the Y moving members 13*a* and 13*b*.

The procedure for aligning a mirror will now be described. For briefly describing the procedure, the moving part 1 is first aligned using noncontacting instrumentation means 65 provided on the fixed part 2 (alignment at this time is performed based on design values or the like stored in advance), test exposure and measurement of a waver aberration are carried out in this state, and then the moving part 1 is aligned again. Thereafter, for very small errors in position of the mirror such as errors in position of the mirror resulting from heat during exposure, the moving part 1 is aligned using the noncontacting instrumentation means 42 provided on the basic structure 41. If there is the possibility that the position of the mirror is significantly changed, e.g. after the power of an exposure apparatus is turned on again, or after transportation, this step is carried out again. The above step will be described in detail below. Here, for alignment of the mirror, the mirror may be aligned based on the wave aberration measurement result of measuring the wave aberration of the optical system, without carrying out alignment of the mirror (driving) in advance.

The moving part 1 and the fixed part 2 each comprise a kinematic mount 62, so that the moving part 1 can be positioned with respect to the fixed part 2. However, the kinematic mount 62 has a positioning accuracy of about several hundreds nm, and therefore is not sufficient as means for positioning the moving part 1 for which a positioning accuracy in the order of nanometers is required. Thus, the moving part 1 is aligned with respect to the fixed part 2 using a positioning sensor 63 as the noncontacting instrumentation means 65 of the 25 positioning sensor 63, an electric capacity sensor, an eddy current sensor, a differential trans displacement sensor, and/or laser interferometer and the like can be considered. In this case, the electric capacity sensor is used. The accuracy of the electric capacity sensor has an accuracy of several tens nm. As shown in FIG. 17, a sensor target 64 is provided on the moving part 1 side, and the electric capacity sensor is provided on the fixed part 2 side. The positioning sensor 63 is provided so that the moving part 1 can be positioned with respect to the X, Y and Z directions of the fixed part 2. Here, three positioning sensors are used, but any other number of positioning sensors mat be used as necessary.

The method for positioning the moving part 1 with respect to the fixed part 2 will now be described.

First, the kinematic mounts 62 of the moving part 1 and the fixed part 2 are abutted against each other. Then, the position of the moving part 1 is controlled using an optical element micro adjustment mechanism 61. If the position of the moving part 1 is shifted so that the value of the positioning sensor 63 equals a certain value (e.g. 0), the moving part 1 can be positioned with respect to the fixed part 2.

However, since the imposition error of the fixed part and the accuracy of the positioning sensor 63 are about several tens nm, there is an error of several tens nm in the positioning accuracy of each moving part. Thus, for correcting the position of each moving part, test exposure is carried out, and the position of the moving part 1 is corrected using the optical element micro adjustment mechanism 61 so that a required relation of image formation is satisfied. In this way, the required relation of image formation can be obtained.

In this way, alignment of the moving part 1 including the optical element (mirror) in the pre-exposure stage is completed.

However, even if a correct relation of image formation is one obtained, a correct relation of image formation can no longer obtained due to thermal distortion of the optical element 32 resulting from exposure heat as exposure is repeated. Thus, for maintaining a correct relation of image formation, test exposure must be performed not only at a time when the operation of the exposure apparatus is started but also at constant intervals to correct the position of each moving part. The constant intervals include, for example, time over which the exposure apparatus is operated, the number of exposed wafers, the amount of increase in temperature of the optical element 32 (lens or mirror), and the integrated amount of exposure energy.

Now, a method for readjusting the position of the moving part 1 when the position of the moving part 1 is shifted due to influences of exposure heat and the like will be described.

The moving part 1 of the exposure apparatus is provided with a sensor target 5, and the exposure apparatus of this Example has noncontacting instrumentation means 42 for measuring positions of the moving part 1 in directions of six axes with respect to a basic structure 41 using its sensor target 5. The noncontacting instrumentation means 42 should effectively act in the moving range of the moving part 1, and may be constituted by, for example, an ultrasonic sensor, optical sensor, laser interferometer or linear scale.

FIG. 17 shows an example of using a laser interferometer for noncontacting instrumentation means 42 for all axes. Six light beams are applied to the moving part 1 to measure six degree-of-freedom positions in the moving part 1. In the example shown of FIG. 17, the position in the X direction and the amounts of rotation in directions of θy (about Y axis) and θz (about Z axis) of the moving part 1 can be measured with three interferometer beams parallel to the X axis and different in Z and Y positions. Furthermore, the position in the Y direction and the amount of rotation in the direction of θx (about X axis) can be measured with two interferometer beams parallel to the Y axis and different in Z position. Further, the position in the Z direction can be measured with an interferometer beam parallel to the Z axis. The laser interferometer applying laser light is provided on the basic structure 41. In FIG. 16, the basic structure 41 is provided aside from the fixed part 2 and the structure frame 24, but the basic structure 41 may be identical to the fixed part 2 and the structure frame 24 or may be provided integrally therewith.

In this way, during operation of the exposure apparatus, six degree-of-freedom positions of the moving part 1 with respect to the basic structure are measured using the noncontacting instrumentation means 42, and based on the result of the measurement, the moving part 1 is driven with high accuracy using a driving mechanism 29, whereby even if the position of the optical element (mirror, etc.) of the exposure apparatus is shifted, the optical element can be appropriately driven, thus making it possible to maintain the optical performance of the exposure apparatus (projection optical system). By this method, the position of the optical element is readjusted when the position of the optical element is shifted, or the like.

Of course, this method is not exclusively used when the position of the optical element is shifted. For example, if the alignment accuracy of first measurement means (electric capacity sensor) is higher than that of second measurement means (ultrasonic sensor, laser interferometer or linear scale), alignment based on the second measurement means may be performed after alignment based on the first measurement means to perform alignment with high accuracy.

In this Example, test exposure is carried out or measurement of the wave aberration is carried out, and based on the result thereof, the optical element is driven, but the present invention is not limited thereto. For example, the exposure may comprise means capable of calculating a position at which the optical element is placed according to an environment in the exposure apparatus (e.g. temperature, contamination, pressure, refractivity, etc.), or means for storing relations between the environment in the exposure apparatus and the position of the optical element with a table, wherein the environment in the exposure apparatus is measured, a position at which the optical element should be placed is determined using calculation means or storage means, based of the result of the measurement, and the optical element is placed at the position. Of course, instead of actually measuring the environment itself, environment may be estimated in advance by experiments, simulation or the like, and means for storing the result of the estimation may be provided, and the optical element may be driven based on the result of the estimation.

If a body to be processed (wafer, etc.) is exposed using the exposure apparatus, it is usually expected that the temperature of the optical element 32 is increased due to exposure heat as described previously. If the temperature of the optical element 32 is increased to the extent that a certain amount of deformation is exceeded, a correct relation of image formation can be no longer obtained. Thus, in this Example 1, cooling means 71 for cooling the optical element 32 is provided. In consideration of alignment accuracy of the optical element 32, it is desirable that the cooling means 71 is provided in the fixed part 2 as shown in FIG. 19, so that the optical element 32 can be cooled in a noncontact manner. Noncontacting cooling means includes radiation cooling. Various types of means for radiation cooling are available, but in this Example 1, a radiation member (radiation plate) is cooled using a Peltier element, and the moving part 1 (particularly optical element 32) is cooled using radiation from the radiation member. Of course, as a method for cooling the radiation member, a coolant is made to flow through the radiation member or on the surface of the radiation member to cool the radiation member, or other cooling means may be used.

Furthermore, EUV light is easily absorbed by a material, and if EUV light reacts with contaminations, carbon and the like are deposited on the surface of the optical element 32 to reduce the reflectivity of the optical element 32. Therefore, the partial pressure of contaminations in a body tube space 80, through which EUV light passes, should be kept at a low level.

Figure 21:
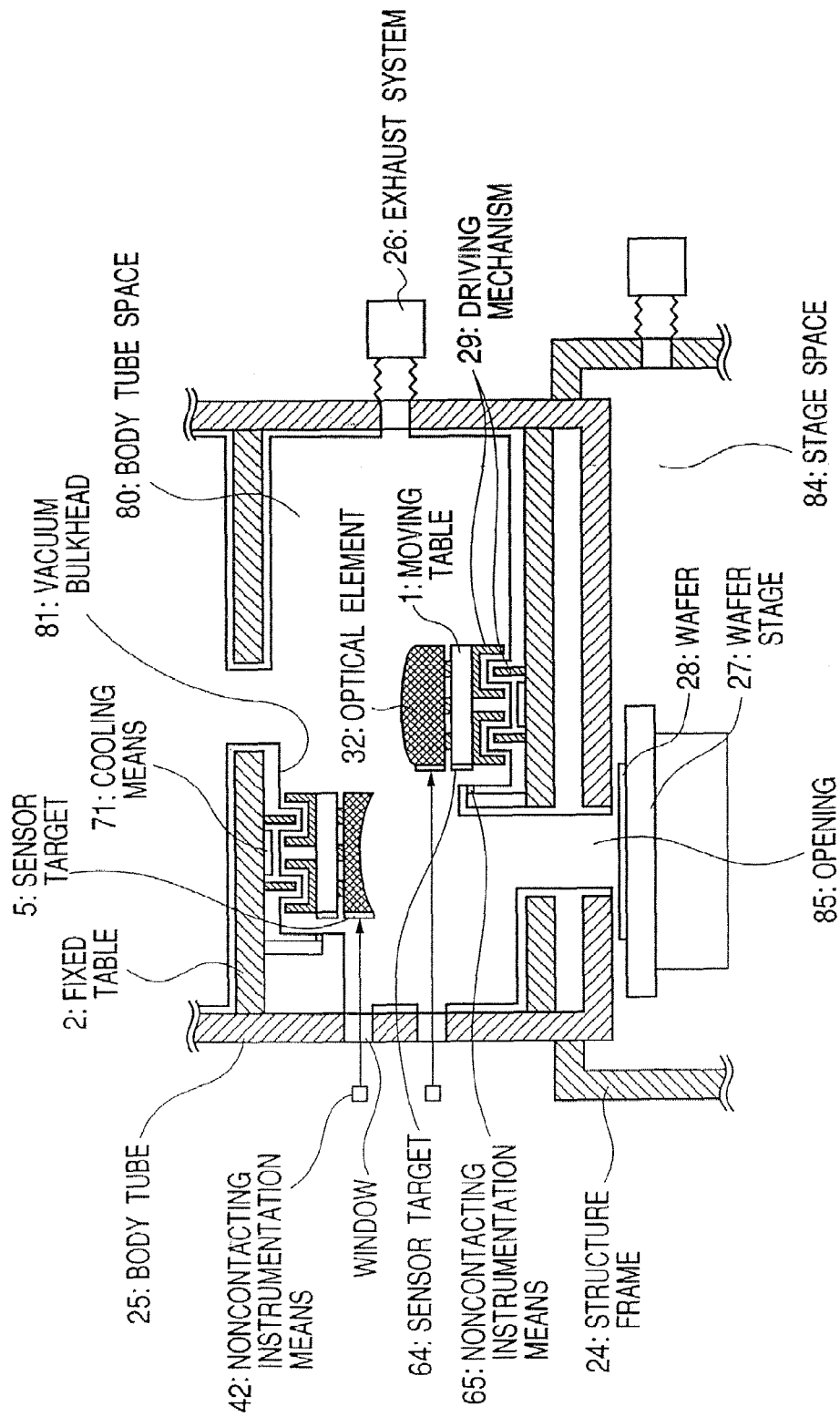
FIG. 21 shows Example of a vacuum bulkhead.

For keeping the partial pressure of contaminations at a low level, a vacuum bulkhead 81 is provided between the moving part 1 and the fixed part 2 of the optical element positioning apparatus as shown in FIG. 21. Materials of the vacuum bulkhead 81 include electrolytically polished aluminum and stainless, titanium, ceramics, fluororesin and glass. However, if driving means 29 is influenced by an electric field or magnetic field like the linear motor of FIG. 21, a nonmagnetic material or insulation material should be used for the vacuum bulkhead 81 between the moving part 1 and the fixed part 2.

Although not shown in FIG. 21, it is desirable that an exhaust system is provided outside the vacuum bulkhead for keeping the partial pressure of contaminations in the body tube space 80 at a low level.

Noncontacting instrumentation means 65 of FIG. 21 is provided inside the vacuum bulkhead, but it may be provided outside the vacuum bulkhead together with a window or the like. Furthermore, the cooling apparatus 71 may be provided inside the vacuum bulkhead 81 depending on the configuration of apparatus.

Figure 22:
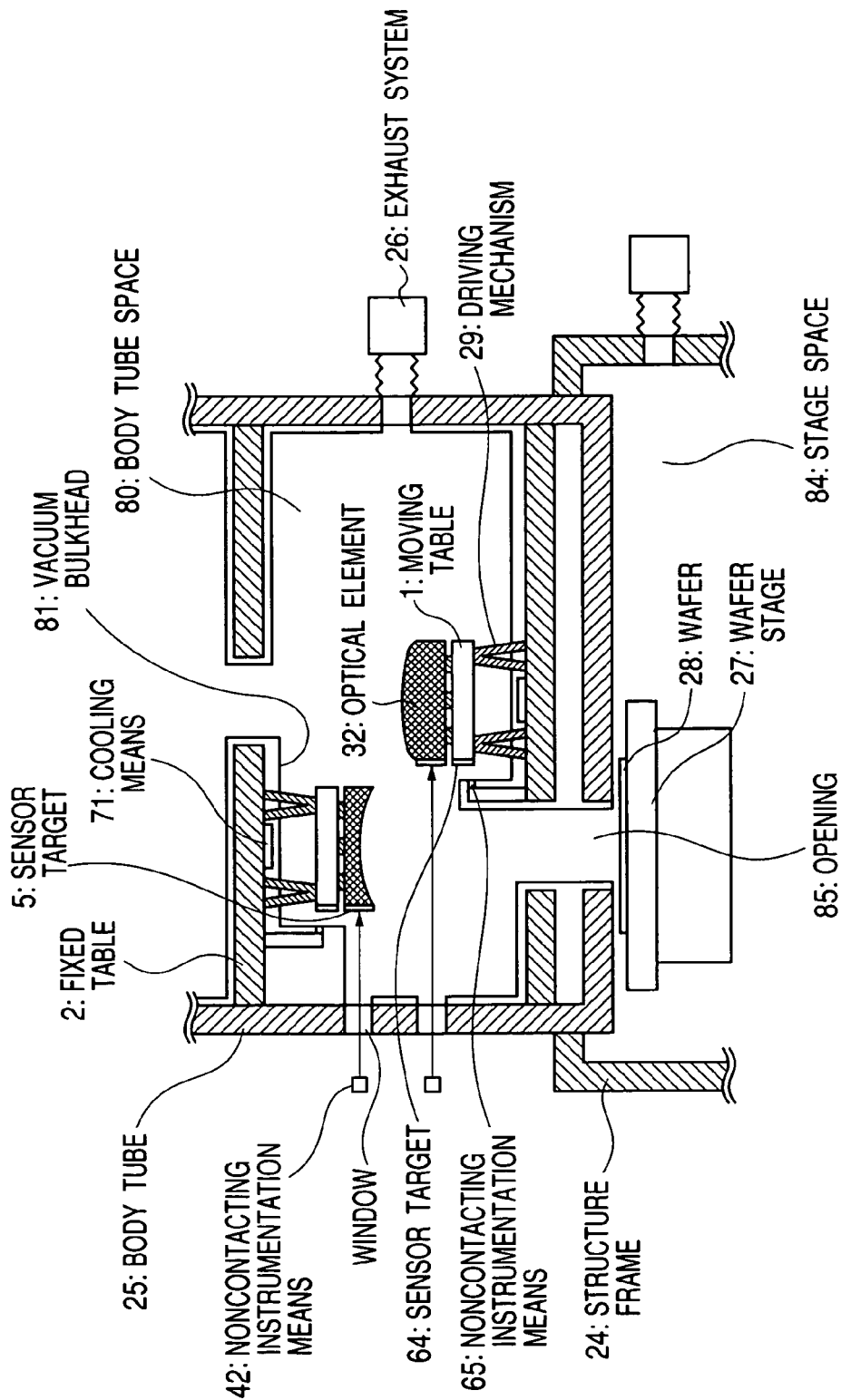
FIG. 22 shows Example of the vacuum bulkhead.

If the driving means 29 is connected to the moving part 1 and the fixed part 2 like a parallel link mechanism, the vacuum bulkhead 81 is provided in such a manner as to cover the driving means 29 as shown in FIG. 22.

The partial pressure of contaminations in the body tube space 80 of FIG. 21 is different from the partial pressure of contaminations in a stage space 84, and for keeping a difference in partial pressure of contaminations, the surface, in which an opening 85 is formed, is placed in proximity to the surface of a wafer to provide a differential exhaust.

Figure 23:
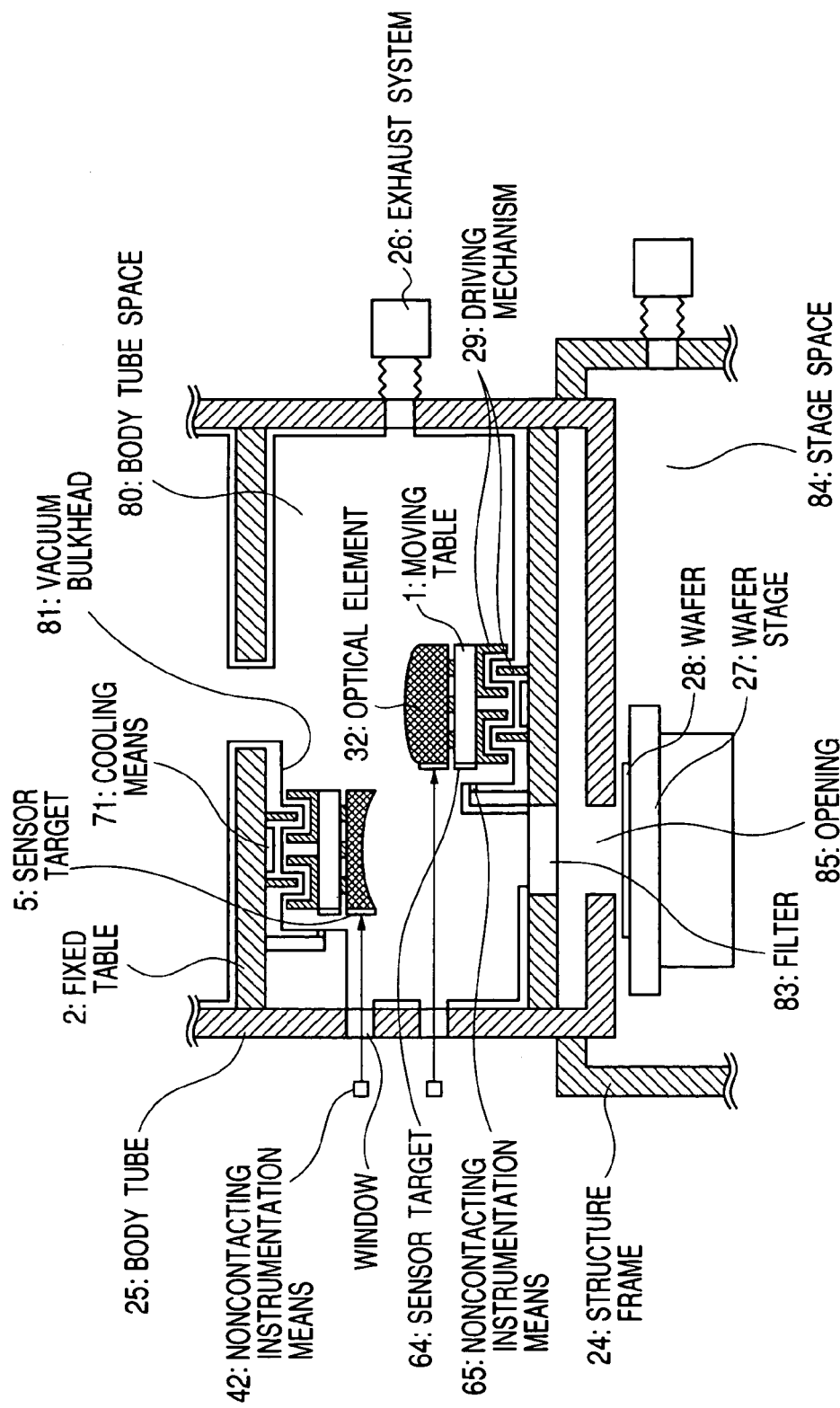
FIG. 23 shows Example of a filter.

Further, for preventing flow of contaminations from the stage space 84 into the body tube space 80, a filter 83 may be provided in the opening 85 as shown in FIG. 23. For the filter, polypropylene, zirconium, boron, silicon, silicon nitride, beryllium, or the like is used.

Figure 24:
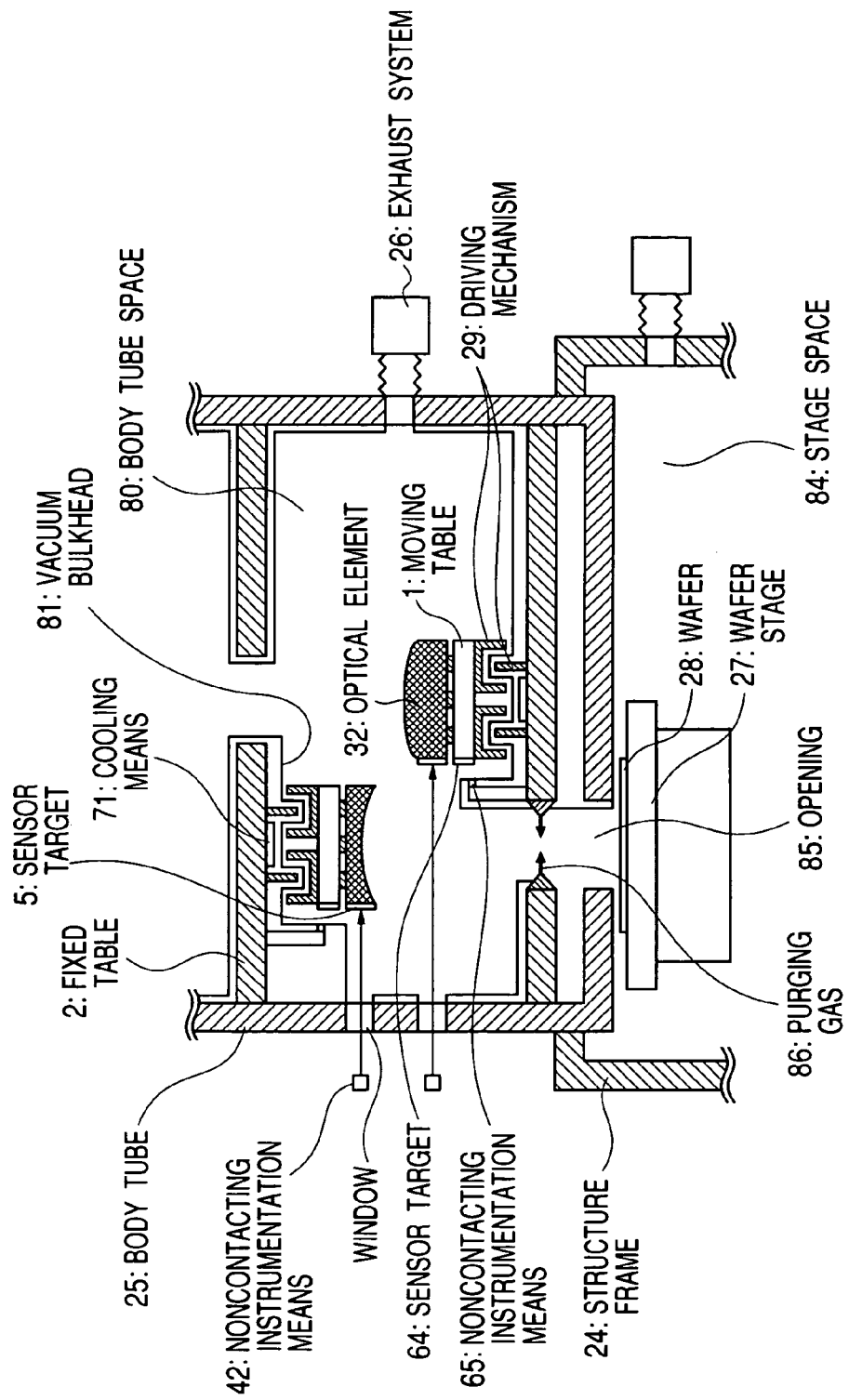
FIG. 24 shows Example of purging gas.

Furthermore, for preventing flow of contaminations from the stage space 84 into the body tube space 80, purging gas 86 may be blown into the opening 85 as shown in FIG. 24. For the purging gas 86, inert gas having high transmissivity to EUV light is preferably used. For example, helium or argon is preferable.

FOURTH EXAMPLE

Fourth Example of an optical element positioning apparatus will now be described. Fourth Example is based on third Example, and aspects different from those of third Example will be mainly described.

Figure 25:
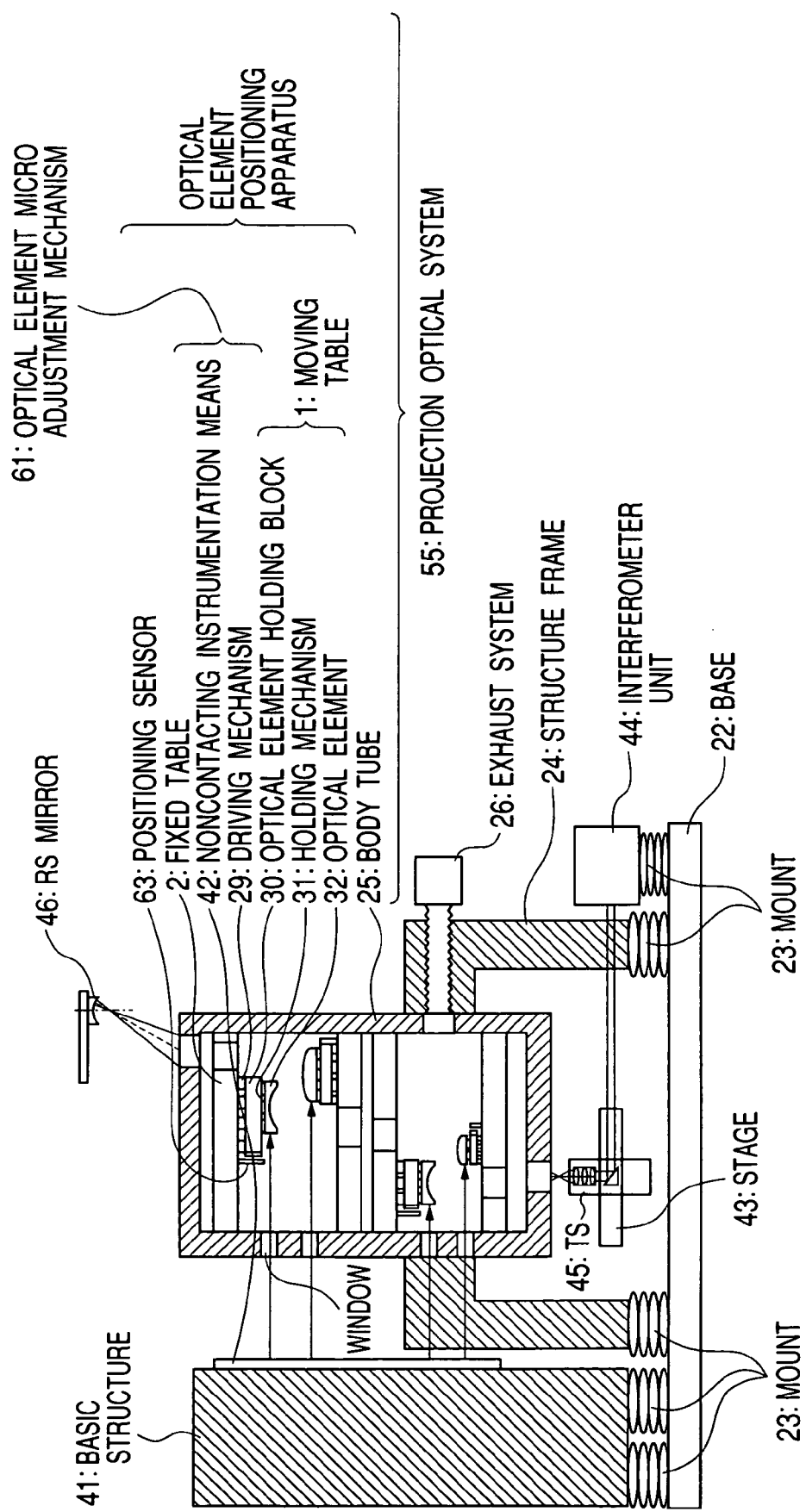
FIG. 25 is a schematic illustration of fourth Example, showing an outline of a wave aberration measurement apparatus.

In Example 4, as shown in FIG. 25, a wave aberration measurement apparatus is mounted on an exposure apparatus main body, and this apparatus can be used to measure the position of an optical element 32 in a projection optical system (it can be considered as the position of a moving part 1 holding the optical element 32).

The wave aberration measurement apparatus will now be described using FIG. 25. Fluxes of light from an interferometer unit 44 are applied to an optical system including a TS (Transfer Sphere) 45 provided on a stage. Some of the fluxes of light are returned back to the interferometer unit 44 from the TS 45, and the other fluxes pass via a projection optical system 55 placed in the body tube 25, are reflected by an RS (Reference Sphere) 46 provided on the back surface of the reticle (or mask) stage, enter the interferometer unit 44 via the projection optical system 55 and the TS 45 again, and interfere with fluxes of light not passing via the projection optical system 55 and the like. From the intensity distribution thereof, wave aberrations of the projection optical system 55 can be measured, and the TS 45 and the RS 46 are driven to measure wave aberrations at a plurality of points in an exposure area, whereby the positions and angles of the optical elements, the surface of the wafer and the surface of the mask can be calculated. Thus, the positions of the optical element 32 and the like can be corrected using a wave aberrometer and an optical element micro adjustment mechanism 61.

A method for positioning the optical element 32 using the wave aberrometer will now be described.

First, the moving part 1 and the fixed part 2 are abutted against a kinematic mount 62. Then, the position of the moving part 1 is controlled using an optical element micro adjustment mechanism 61. If the position of the moving part 1 is shifted so that the value of the positioning sensor 63 equals a certain value (e.g. 0), the moving part 1 can be positioned with respect to the fixed part 2. As described in Example 3, since the imposition error of the fixed part and the accuracy of the positioning sensor 63 are about several tens nm, there is an error of several tens nm in the positioning accuracy of each moving part. Thus, for correcting the position of each moving part, the position of each optical element 32 (moving part 1) is measured using the wave aberrometer, and the position of the optical element 32 (moving part 1) is corrected using the optical element micro adjustment mechanism 61. In this way, a required relation of image formation can be obtained.

Once the position of each optical element is corrected using the wave aberrometer, each optical element can be positioned according to information of measurement by noncontacting instrumentation means 42 for a while. If measurement by noncontacting instrumentation means is interrupted, however, correction of the position of each optical element by the wave aberrometer should be done over again. A correct relation of image information can no longer obtained due to thermal deformation of the optical element 32 by exposure heat, and so on, as exposure is repeated. Thus, for maintaining a correct relation of image formation, the position of each optical element should be corrected not only at a time when the operation of the exposure apparatus is started but also at constant intervals to correct the position of each moving part. The constant intervals include, for example, time over which the exposure apparatus is operated, the number of exposed wafers, the amount of increase in temperature of the optical element (lens or mirror), and the integrated amount of exposure energy.

The correction of the position of each optical element by test exposure described in Example 3 may be used in conjunction with the correction of the position using the wave aberrometer.

FIFTH EXAMPLE

The third embodiment of an optical element positioning apparatus will now be described. Fifth Example is based on third Example, and aspects different from those of third Example will be mainly described.

Figure 26:
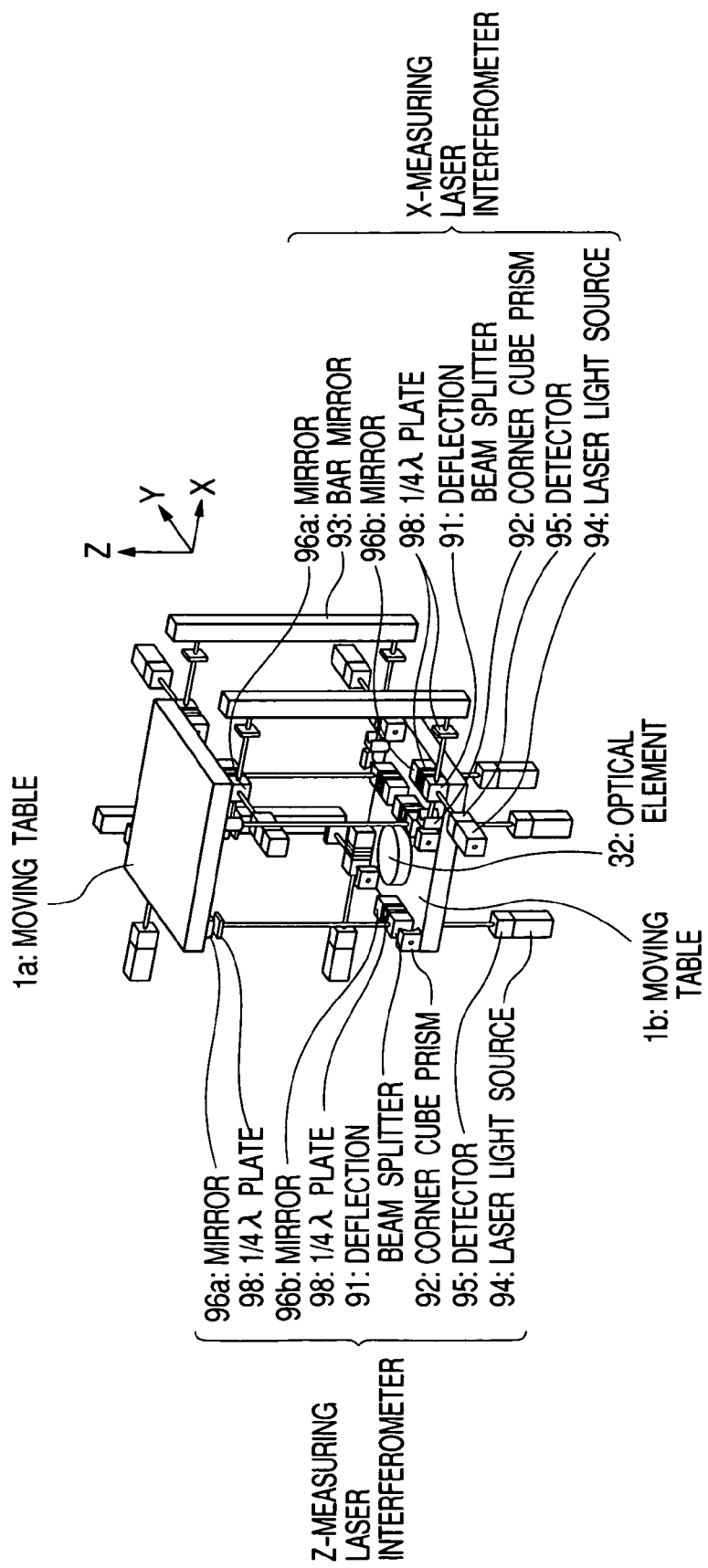
FIG. 26 is a schematic illustration of fifth Example, which is a schematic illustration of the third embodiment.

In Example 5, relative displacements in directions of six axes between different mobbing parts are measured using noncontacting instrumentation means, and based on information of the measurement, the moving parts are positioned by a driving mechanism 29. The outline thereof is shown in FIG. 26.

A laser interferometer is used as noncontacting instrumentation means. Relative displacements at three locations in the direction of the Z axis between a moving part 1$a$ and a moving part 1$b$ are measured to determine a relative displacement in the direction of the Z axis, and relative angles about X and Y axes. Furthermore, relative displacement at two different locations in the direction of the X axis between the moving part 1$a$ and the moving part 1$b$ are measured to determine a relative displacement in the direction of the X axis and a relative angle about the Z axis. Further, a relative displacement in the direction of the. Y axis between the moving part 1$a$ and the moving part 1$b$ is measured.

First, a method for measuring the relative displacement in the direction of the Z axis will be described. Laser light emitted from a laser light source 94 is branched into measurement light and reference light by a polarization beam splitter 91 fixed on the moving part 1$b$.

Measurement light passes through a ¼ λ plate 98, is reflected by a mirror 96$a$ foxed on the moving part 1$a$, passes through the ¼ λ plate 98, and returns to the polarization beam splitter 91. The returning measurement light is reflected by a corner cube prism 92, again passes through the polarization beam splitter, passes through the ¼ λ plate 98, is reflected by the mirror 96$a$ fixed on the moving part 1$a$, passes through the ¼ λ plate. 98, passes through the polarization beam splitter, and then enters a detector 95.

Reference light leaving the polarization beam splitter 91 passes through the ¼ λ plate 98, is reflected by a mirror 96$b$ fixed on the mobbing part 1$b$, passes through the ¼ λ plate 98, passes through the polarization beam splitter 91, is then reflected by the corner cube prism, and then passes through the beam splitter 91 again. Thereafter, the reference light passes through the ¼ λ plate 98, is reflected by the mirror 96$b$ fixed on the moving part 1$b$, passes through the ¼ λ plate 98, passes through the polarization beam splitter 91, and then enters the detector 95. Measurement light and reference light are made to interfere with each other at the detector 95, whereby a relative displacement in the direction of the Z axis between the moving part 1$a$ and the moving part 1$b$ can be measured.

A method for measuring relative displacements in directions of X and Y axes will now be described. Since the method for measurement of a displacement in the direction of the X axis is same as that for measurement of a displacement in the direction of the Y axis, the method for measurement in the direction of the X axis will be described as an example. Laser light emitted from the laser light source 94 is branched into measurement light and reference light by the polarization beam splitter 91 fixed on the moving part 1$b$.

Measurement light passes through the ¼ λ plate 98, is reflected by a bar mirror 93 fixed on a basic structure 41, passes through the ¼ λ plate 98, passes through the polarization beam splitter 91, is then reflected by the corner cube prism 92, and passes through the polarization beam splitter 91 again. Thereafter, the measurement light passes through the ¼ λ plate 98, is reflected by the bar mirror 93, passes through the ¼ λ plate 98, passes through the polarization beam splitter 91, and then enters the detector 95.

Reference light leaving the polarization beam splitter 91 passes through the ¼ λ plate 98, is reflected by the mirror 96$b$ fixed on the moving part 1$b$, passes through the ¼ λ plate 98, passes through the polarization beam splitter 91, is then reflected by the corner cube prism 92, and passes through the polarization beam splitter 91 again. Thereafter, the reference light passes through the ¼ λ plate 98, is reflected by the mirror 96$b$, passes through the ¼ λ plate 98, passes through the polarization beam splitter 91, and then enters the detector 95.

Measurement light and reference light are made to interfere with each other at the detector 95, whereby a relative displacement of the moving part 1b in the direction of the X axis with respect to the basic structure 41 can be measured.

Similarly, a relative displacement of the moving part 1a in the direction of the X axis with respect to the basic structure 41 is measured, and a difference between the relative displacement of the moving part 1a in the direction of the X axis with respect to the basic structure 41 and the relative displacement of the moving part 1b in the direction of the X axis with respect to the basic structure 41 is calculated, whereby a relative displacement in the direction of the X axis between the moving part 1a and the moving part 1b can be determined.

A command value to the driving mechanism 29 of the moving part 1a and the moving part 1b is calculated by a compensator based on information of the relative displacements in directions of six axes between the moving part 1a and the moving part 1b measured by the method described above. A PID compensator is used as the compensator.

As described above, in this Example, by controlling the relative displacement between different optical elements 32, a required relation of image formation can be obtained.

In this Example, the position of each optical element mat be corrected by test exposure, or the position may be corrected using the wave aberrometer.

SIXTH EXAMPLE

The sixth Example of an optical element positioning apparatus will now be described. Sixth Example is based on fifth Example, and aspects different from those of fifth Example will be mainly described.

Figure 27:
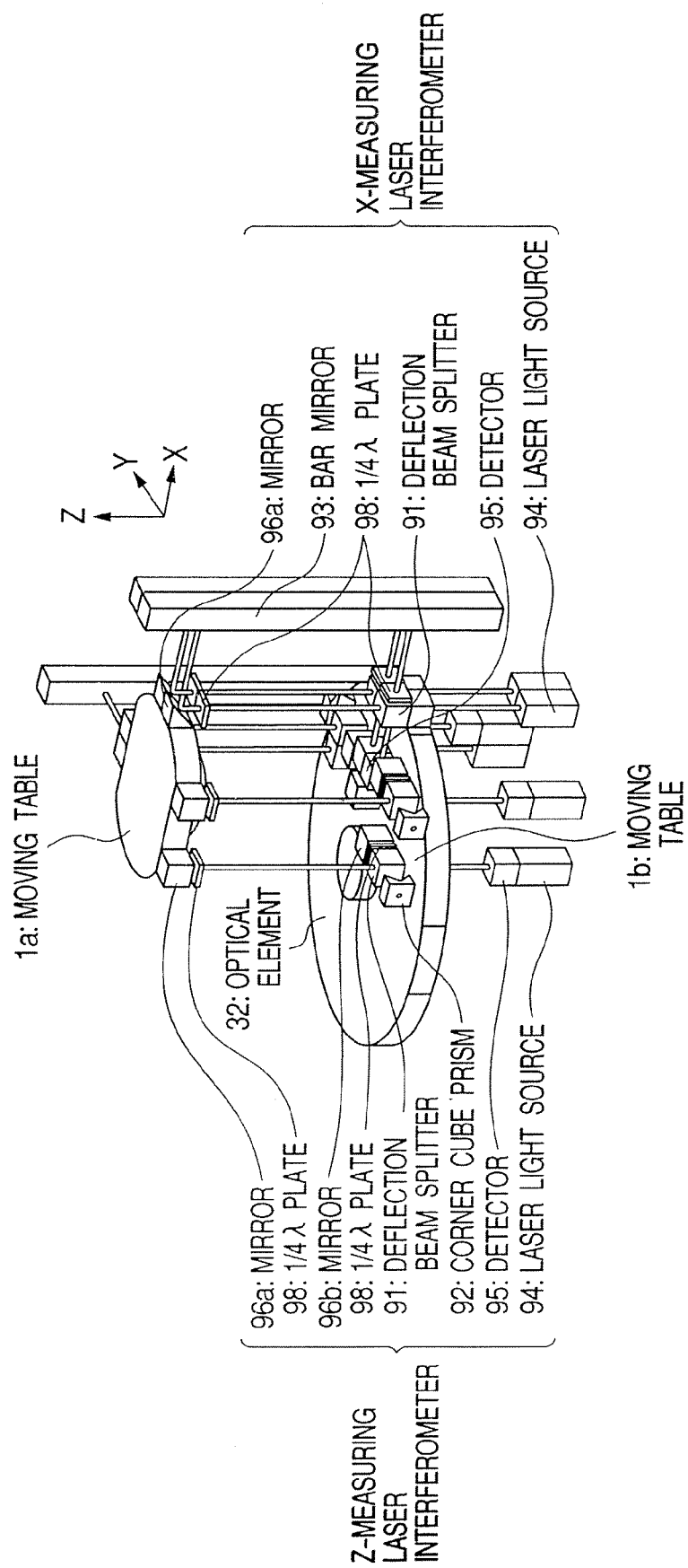
FIG. 27 is a schematic illustration of sixth Example.

In Example 6, relative displacements in directions of six axes between different mobbing parts are measured using noncontacting instrumentation means, and based on information of the measurement, the moving parts are positioned by a driving mechanism 29. The outline thereof is shown in FIG. 27.

A laser interferometer is used as noncontacting instrumentation means. Relative displacements at three locations in the direction of the Z axis between a moving part 1a and a moving part 1b are measured to determine a relative displacement in the direction of the Z axis, and relative angles about X and Y axes. Furthermore, relative displacement at two different locations in the direction of the X axis between the moving part 1a and the moving part 1b are measured to determine a relative displacement in the direction of the X axis and a relative angle about the Z axis. Further, a relative displacement in the direction of the Y axis between the moving part 1a and the moving part 1b is measured.

A method for measuring a relative displacement in the direction of the Z axis is same as that of Example 5.

A method for measuring relative displacements in directions of X and Y axes will now be described. Laser light emitted from a laser light source 94 is branched into measurement light a and measurement light b by a polarization beam splitter 91 fixed on the moving part 1b.

Measurement light a passes through a ¼ λ plate 98, is reflected by a mirror 96a fixed on the moving part 1a, reflected by a bar mirror 93 fixed on a basic structure 41, and reflected by the mirror 96a, passes through ¼ λ plate 98, passes through the polarization beam splitter 91, and then enters a detector 95.

Measurement light b passes through the ¼ λ 98, is reflected by the bar mirror 93, passes through the ¼ λ plate 98, passes through the polarization beam splitter 91, and then enters the detector 95. Measurement light a and reference light b are made to interfere with each other at the detector 95, whereby an amount of displacement with a relative displacement in the direction of the X or Y axis between the moving part 1a and the moving part 1b combined with a relative displacement in the direction of the Z axis can be measured. By subtracting the previously measured relative displacement in the direction of the Z axis from the amount of displacement, the relative displacement in the direction of the X or Y direction can be determined.

A command value to the driving mechanism 29 of the moving part 1a and the moving part 1b is calculated by a compensator based on information of the relative displacements in directions of six axes between the moving part 1a and the moving part 1b measured by the method described above. A PID compensator is used as the compensator.

As described above, in this Example, by controlling the relative displacement between different optical elements 32, a required relation of image formation can be obtained.

In this Example, the position of each optical element mat be corrected by test exposure, or the position may be corrected using the wave aberrometer.

SEVENTH EXAMPLE

The seventh embodiment of an optical element positioning apparatus will now be described. Seventh Example is based on fifth Example, and aspects different from those of fifth Example will be mainly described.

Figure 28:
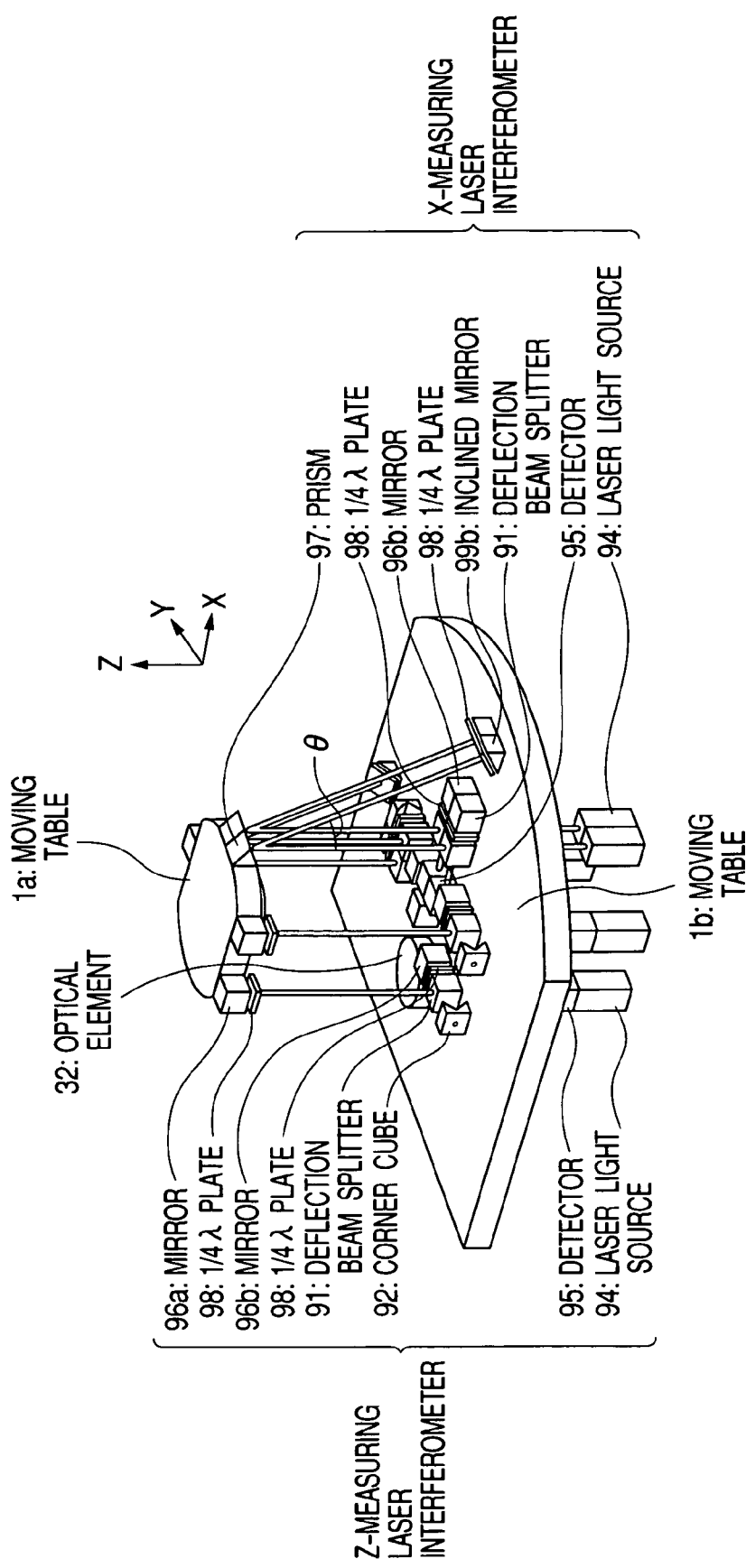
FIG. 28 is a schematic illustration of seventh Example, which is a schematic illustration of the fifth embodiment.

In Example 7, relative displacements in directions of six axes between different mobbing parts are measured using noncontacting instrumentation means, and based on information of the measurement, the moving parts are positioned by a driving mechanism 29. The outline thereof is shown in FIG. 28.

A laser interferometer is used as noncontacting instrumentation means. Relative displacements at three locations in the direction of the Z axis between a moving part 1a and a moving part 1b are measured to determine a relative displacement in the direction of the Z axis, and relative angles about X and Y axes. Furthermore, relative displacement at two different locations in the direction of the X axis between the moving part 1a and the moving part 1b are measured to determine a relative displacement in the direction of the X axis and a relative angle about the Z axis. Further, a relative displacement in the direction of the Y axis between the moving part 1a and the moving part 1b is measured.

A method for measuring a relative displacement in the direction of the Z axis is same as that of Example 5.

A method for measuring relative displacements in directions of X and Y axes will now be described. Since the method for measurement of a displacement in the direction of the X axis is same as that for measurement of a displacement in the direction of the Y axis, the method for measurement in the direction of the X axis will be described as an example. Laser light emitted from a laser light source 94 is branched into measurement light and reference light by a polarization beam splitter 91 fixed on the moving part 1b.

Measurement light is refracted by a prism 97 fixed on the moving part 1a, passes through a ¼ λ plate 98, is reflected by an inclination mirror 99b fixed on the moving part 1b, passes through the ¼ λ plate 98, is refracted by the prism 97 again, passes through the polarization beam splitter 91, and then enters a detector 95. An angle formed by the reflection surface of the inclination mirror 99b and the surface orthogonal to the Z axis of the optical element 32 equals an angle formed by incoming light and outgoing light of the prism 97 (θ in FIG. 28).

Reference light leaving the polarization beam splitter 91 passes through the ¼ λ plate 98, is reflected by a mirror 96b fixed on the moving part 1b, passes through the ¼ λ plate 98, passes through the deflection beam slitter 91, and enters the detector 95. Measurement light and reference light are made to interfere with each at the detector 95, whereby an amount of displacement with a relative displacement in the direction of the X axis between the moving part 1a and the moving part 1b combined with a relative displacement in the direction of the Z axis can be measured. By subtracting the previously measured relative displacement in the direction of the Z axis from the amount of displacement, the relative displacement in the direction of the X direction can be determined. Furthermore, by changing the magnitude of refraction by the prism, the resolution of measurement in the direction of the X or Y axis can be changed. That is, as θ in FIG. 28 increases (0°<θ<90°), the resolution of measurement in the direction of the X or Y axis improves.

A command value to the driving mechanism 29 of the moving part 1a and the moving part 1b is calculated by a compensator based on information of the relative displacements in directions of six axes between the moving part 1a and the moving part 1b measured by the method described above. A PID compensator is used as the compensator.

As described above, in this Example, by controlling the relative displacement between different optical elements 32, a required relation of image formation can be obtained.

In this Example, the position of each optical element mat be corrected by test exposure, or the position may be corrected using the wave aberrometer.

Figure 29:
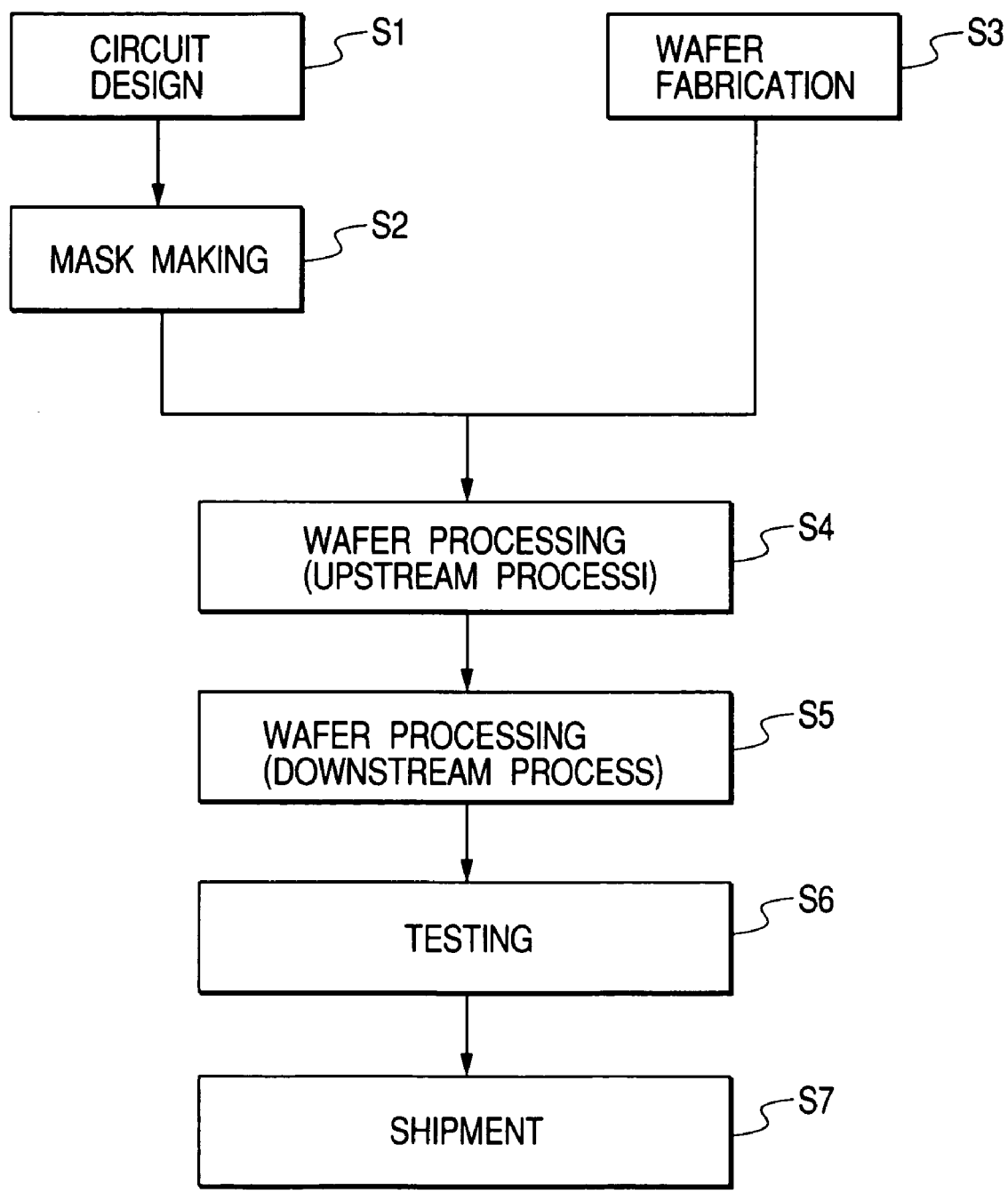
FIG. 29 is a flowchart for illustrating production of devices (semiconductor chips such as IC and LSI, LCD, CCD, etc.)

A method for producing a device using the exposure apparatus 1 described above will now be described with reference to FIGS. 29 and 30. FIG. 29 is a flowchart for illustrating production of a device (semiconductor chip such as IC or LSI, LCD, CCD, etc.). In this embodiment, production of a semiconductor chip is described as an example. At step 1 (circuitry design), circuitry of the device is designed. At step 2 (mask making), a mask having a designed circuitry pattern formed thereon is made. At step 3 (fabrication of wafer), a wafer is fabricated using a material such as silicon. At step 4 (wafer process), which is called a upstream process the mask and the wafer are used to form actual circuitry on the wafer by lithography technique. At step 5 (assembly), which is called a downstream process, the wafer fabricated at step 4 is used to form a semiconductor chip, and the step includes steps such as an assembly step (dicing, bonding), and a packaging step (encapsulation of chip). At step 6 (testing), testing such as an operation test and a durability test for the semiconductor device fabricated at step 5 are performed. Through these steps, the semiconductor device is completed, and is shipped (step 7).

Figure 30:
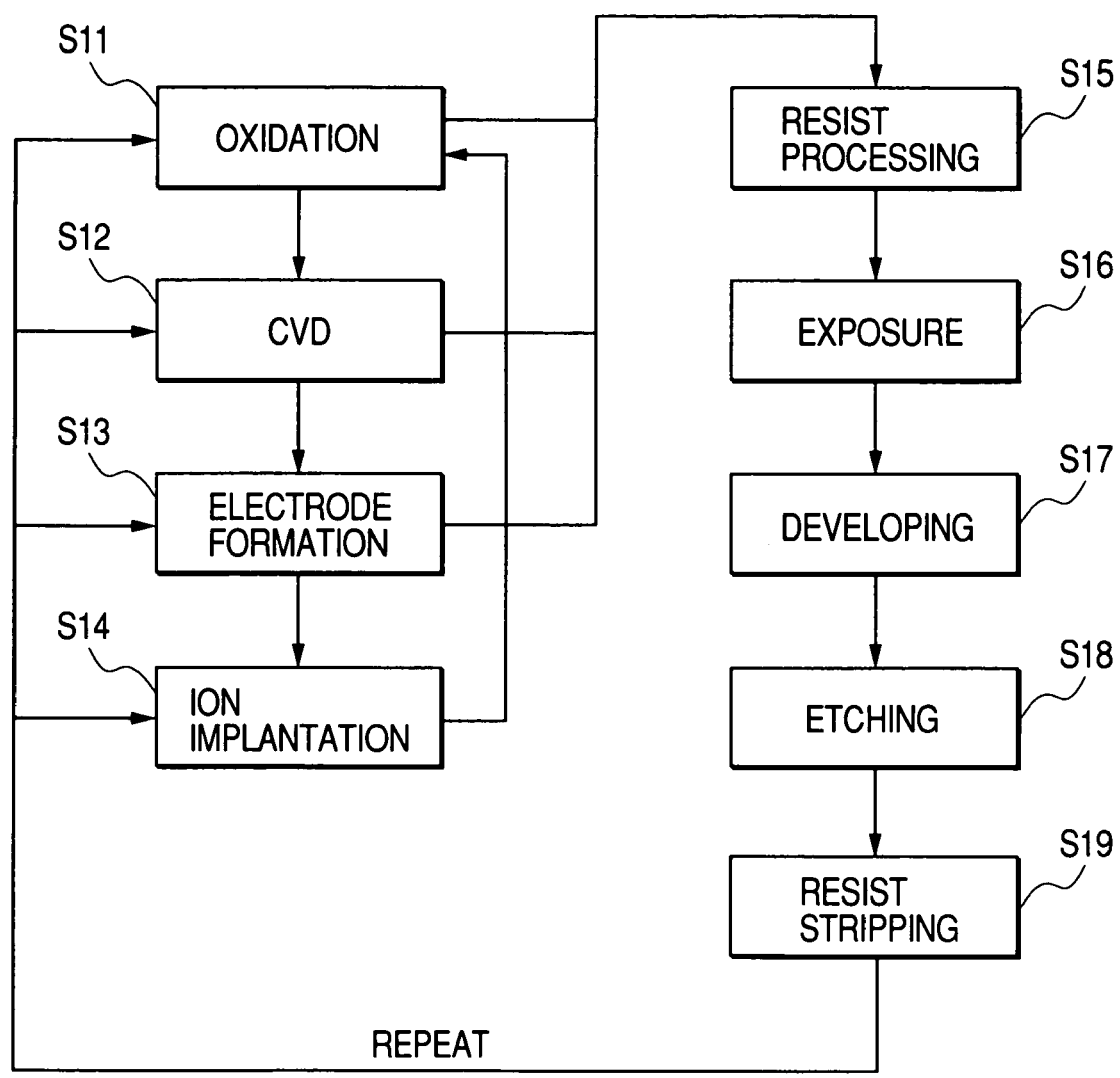
FIG. 30 is a detailed flowchart of a wafer process of step 4 shown in FIG. 29.

FIG. 30 is a detailed flowchart of the wafer process at step 4. At step 11 (oxidation), the surface of the wafer is oxidized. At step 12 (CVD), an insulation film is formed on the surface of the wafer. At step 14 (ion implantation), ions are implanted into the wafer. At step 15 (resist processing), the wafer is coated with a sensitizing agent. At step 16 (exposure), the wafer is exposed to the circuitry pattern of the mask by the exposure apparatus 1. At step 17 (developing), the exposed wafer is developed. At step 18 (etching), portions other than developed resist images are chipped off. At step 19 (resist stripping), resists that are no longer needed after etching are removed. By repeating these steps, multiple circuitry patterns are formed on the wafer. According to the method for producing a device in this embodiment, devices of high quality can be produced compared to the conventional method. In this way, the device production method using the above exposure apparatus, and the device produced as a result also constitute one aspect of the present invention.

Embodiments of the present invention can be described as follows.

EMBODIMENT 1

A positioning apparatus comprising:

first measurement means for measuring a position/inclination of a moving part having an optical element while being kept from contact with said moving part; and driving means capable of driving said moving part in directions of six axes with respect to a fixed part while being kept from contact with said moving part, based on the result of measurement by said first measurement means.

EMBODIMENT 2

The apparatus according to embodiment 1, wherein said driving means comprises at least six pairs of micro adjustment mechanisms capable of being controlled independently.

EMBODIMENT 3

The apparatus according to embodiment 1, wherein said driving means comprises a first magnetic block in at least one of said fixed part and said moving part, and a coil in the other.

EMBODIMENT 4

The apparatus according to embodiment 3, wherein said driving means comprises a first magnetic block in said moving part and a coil in said fixed part.

EMBODIMENT 5

The apparatus according to embodiment 1, wherein said driving means comprises a first magnetic block in at least one of said fixed part and said moving part, and an electromagnet in the other.

EMBODIMENT 6

The apparatus according to embodiment 5, wherein said driving means comprises a first magnetic block in said moving part and an electromagnet in said fixed part.

EMBODIMENT 7

The apparatus according to embodiment 3, wherein said first magnetic block is a permanent magnet.

EMBODIMENT 8

The apparatus according to embodiment 1, wherein said first measurement means comprises at least one of a laser interferometer, an encoder, an eddy current sensor and an electric capacity sensor.

EMBODIMENT 9

The apparatus according to embodiment 1, comprising support means for adding a force to said moving part in an antigravity direction.

EMBODIMENT 10

The apparatus according to embodiment 9, wherein said support means adds a force to said moving part while being kept from constant with said moving part.

EMBODIMENT 11

The apparatus according to embodiment 9, wherein said support means comprises an elastic member coupling said fixed part with said moving part.

EMBODIMENT 12

The apparatus according to embodiment 9, wherein said support means adds a force substantially equal to the gravity of said moving part to said moving part in an antigravity direction.

EMBODIMENT 13

The apparatus according to embodiment 1, comprising any one of a bellow, a repulsive magnet, a suction magnet and a spring.

EMBODIMENT 14

The apparatus according to embodiment 1, wherein said first measurement means is fixed to said fixed part.

EMBODIMENT 15

The apparatus according to embodiment 1, wherein said moving part is said optical element, and the optical element comprises a target for use in said first measurement means.

EMBODIMENT 16

The apparatus according to embodiment 1, wherein said optical element is a reflection member.

EMBODIMENT 17

An exposure apparatus comprising the positioning mechanism according to any one of embodiments 1 to 16, wherein said optical element is driven by said positioning apparatus.

EMBODIMENT 18

The apparatus according to embodiment 17, comprising:
an optical system including said optical element, guiding light emitted from a light source to a mask, and guiding light passing through the mask to a body to be exposed;
a structure frame supporting the optical system and said fixed part; and
second measurement means for measuring a position and/or inclination of said fixed part with respect to said structure,
wherein said driving means drives said optical element based on the results of measurement by said first measurement means and said second measurement means.

EMBODIMENT 19

The apparatus according to embodiment 18, comprising third means for measuring a position and/or inclination of said structure frame with respect to a basic structure that is different from said structure frame, wherein said driving means drives said optical element based on the results of measurement by said first measurement means, said second measurement means and said third measurement means.

EMBODIMENT 20

The apparatus according to embodiment 17, comprising:
an optical system including said optical element, guiding light emitted from a light source to a mask, and guiding light passing through the mask to a body to be exposed;
a structure frame supporting the optical system and said fixed part; and
fourth measurement means for measuring a position and/or inclination of said fixed part with respect to a basic structure that is different from said structure frame,
wherein said driving means drives said optical element based on the results of measurement by said first measurement means and said fourth measurement means.

EMBODIMENT 21

The apparatus according to embodiment 17, comprising wave aberration measurement means for measuring a wave aberration of said optical system, wherein said measurement means is calibrated by the wave aberration measurement means.

EMBODIMENT 22

The apparatus according to embodiment 17, wherein the inside of said optical system is kept under vacuum.

EMBODIMENT 23

The apparatus according to embodiment 17, wherein the wavelength of light passing through said optical system is 13 to 14 nm.

EMBODIMENT 24

The apparatus according to embodiment 17, comprising cooling means for cooling both said optical element and said driving means by radiation.

EMBODIMENT 25

A method for producing a device; comprising:
an exposure step of exposing a body to be exposed using the exposure apparatus of embodiment 17; and
a developing step of developing said exposed body.

EMBODIMENT 26

A positioning apparatus comprising:
a first moving part including an optical element;
a first fixed part;

first driving means for driving said first moving part with respect to said first fixed part;

first measurement means for measuring a position of said first moving part with respect to said first fixed part;

second measurement means for measuring a displacement of said first moving part with respect to a basic structure; and a first compensator controlling said first driving means based on the result of measurement by said second measurement means, wherein said optical element is positioned using said first driving means, said second measurement means and said first compensator, based on the result of measurement by said first measurement means.

EMBODIMENT 27

The apparatus according to embodiment 26, comprising wave aberration measurement means for measuring a wave aberration of an optical system including said optical element, wherein said optical element is positioned based on the result of measurement by said wave aberration measurement means.

EMBODIMENT 28

The apparatus according to embodiment 27, wherein said first driving means, said second measurement means and said first compensator position said optical element based on the result of measurement by said first measurement means, and then position said optical element based on the result of measurement by said wave aberration measurement means.

EMBODIMENT 29

The apparatus according to embodiment 26, wherein said first measurement means comprises an electric capacity sensor and/or an eddy current sensor and/or a differential trans-displacement sensor and/or laser interferometer.

EMBODIMENT 30

A positioning apparatus comprising:
a first moving part including a first optical element;
a first fixed part;
first driving means for driving said first moving part with respect to said first fixed part;
a second moving part including a second optical element;
a second fixed part;
second driving means for driving said second moving part with respect to said second fixed part;
third measurement means for measuring a relative displacement between said first moving part and said second moving part;
a first compensator controlling said first driving means based on information of measurement by said third measurement means; and
a second compensator controlling said second driving means based on information of measurement by said third measurement means,
wherein said first optical element and said second optical element are positioned using said first compensator and said second compensator.

EMBODIMENT 31

The apparatus according to embodiment 30, comprising wave aberration measurement means for measuring a wave aberration of an optical system including said first optical element and said second optical element, wherein said first optical system and said second optical system are positioned based on the result of measurement of said wave aberration measurement means.

EMBODIMENT 32

The apparatus according to embodiment 30, wherein said third measurement means comprises:
fourth measurement means for measuring relative positions of said first moving part and said second moving part with respect to a first direction at three or more locations;
fifth measurement means for measuring relative positions of said first moving part and said second moving part with respect to a second direction perpendicular to said first direction at two or more locations; and
sixth measurement means for measuring relative positions of said first moving part and said second moving part with respect to a third direction perpendicular to both said first direction and said second direction.

EMBODIMENT 33

The apparatus according to embodiment 32, wherein said first direction is almost identical to the direction of the optical axis of said optical element.

EMBODIMENT 34

The apparatus according to embodiment 32, wherein said fourth measurement means and said fifth measurement means comprise:
a first mirror fixed on said first moving part,
a polarization beam splitter fixed on said second moving part;
a second mirror fixed on said second moving part;
¼ λ plate placed between said polarization beam splitter and said first mirror and between said polarization beam splitter and said second mirror;
a laser light source and a detector provided on almost the opposite side of said first mirror with respect to said polarization beam splitter; and
a corner cube prism provided on almost the opposite side of said second mirror with respect to the polarization beam splitter.

EMBODIMENT 35

The apparatus according to embodiment 32, wherein said fourth measurement means and said fifth measurement means comprise:
a bar mirror fixed on a basic structure;
a first polarization beam splitter fixed on the first moving part;
a first mirror fixed on the first moving part 1;
¼ λ plate provided between the first polarization beam splitter, and the first mirror and the bar mirror;
a first laser light source and a first detector provided on almost the opposite side of the first mirror with respect to the first polarization beam splitter;
a first corner cube prism provided on almost the opposite side of the bar mirror with respect to the first polarization beam splitter;
a second polarization beam splitter fixed on the second moving part;
a second mirror fixed on the second moving part;

¼ λ plate provided between the second polarization beam splitter, and the second mirror and the bar mirror;

a second laser light source and a second detector provided on almost the opposite side of the second mirror with respect to the second polarization beam splitter; and a second corner cube prism provided on almost the opposite side of the bar mirror with respect to the second reflection beam splitter.

EMBODIMENT 36

The apparatus according to embodiment 32, wherein said fourth measurement means and said fifth measurement means comprise:

a bar mirror fixed on the basic structure;

a first mirror fixed on the first moving part;

a polarization beam splitter fixed on the second moving part;

¼ λ plates provided between the deflection splitter, and the first mirror and the bar mirror;

a laser light source provided on almost the opposite side of the first mirror with respect to the polarization beam splitter; and a detector provided on almost the opposite side of the bar mirror with respect to the polarization beam splitter.

EMBODIMENT 37

The apparatus according to embodiment 32, wherein said fourth measurement means and said fifth measurement means comprise:

a prism fixed on the first moving part;

a polarization beam splitter fixed on the second moving part;

a mirror fixed on the moving part 2;

an inclination mirror fixed on the moving part 2;

a ¼ λ plate provided between the polarization beam splitter and the mirror;

a ¼ λ plate provided between the prism and the inclination mirror;

a detector provided on almost the opposite side of the mirror with respect to the polarization beam splitter; and a laser light source provided on almost the opposite side of the prism with respect to the reflection beam splitter.

EMBODIMENT 38

The apparatus according to embodiment 26, wherein said second measurement means comprises any one of a laser interferometer, an encoder, an electric capacity sensor, an eddy current sensor and a differential trans-displacement sensor and/or laser interferometer.

EMBODIMENT 39

The apparatus according to embodiment 30, wherein said third measurement sensor comprises any one of an encoder, an electric capacity sensor, an eddy current sensor and a differential trans-displacement sensor and/or laser interferometer.

EMBODIMENT 40

The apparatus according to embodiment 26, wherein at least one of said first driving means and said second driving means use a six axis micro adjustment mechanism using a linear motor.

EMBODIMENT 41

The apparatus according to embodiment 26, wherein at least one of said first driving means and said second driving means use a six axis micro adjustment mechanism using an electromagnet actuator.

EMBODIMENT 42

The apparatus according to embodiment 26, wherein at least one of said first driving means and said second driving means use a six axis micro adjustment mechanism using a piezoelectric element.

EMBODIMENT 43

The apparatus according to embodiment 26, comprising cooling means cooling said optical element, wherein the cooling means is provided in said first fixed part and/or said second fixed part of said optical element positioning apparatus.

EMBODIMENT 44

The apparatus according to embodiment 43, wherein said cooling means comprises a Peltier element.

EMBODIMENT 45

The apparatus according to embodiment 26, comprising a vacuum bulkhead between said first moving part and said first fixed part and/or said second moving part and said second fixed part.

EMBODIMENT 46

The apparatus according to embodiment 45, wherein a space on the first moving part side of said vacuum bulkhead and/or a space on the second moving side of said vacuum bulkhead are kept under high vacuum.

EMBODIMENT 47

The apparatus according to embodiment 45, wherein any one of electrolytically polished aluminum, electrolytically polished stainless, titanium, ceramics, fluororesin and glass is used for said vacuum bulkhead.

EMBODIMENT 48

The apparatus according to embodiment 26, comprising a body tube including said first moving part, wherein differential exhaust is used for an opening of the body tube, or purging gas is made to pass into the opening of the body tube.

EMBODIMENT 49

The apparatus according to embodiment 48, wherein said purging gas is helium.

EMBODIMENT 50

The apparatus according to embodiment 26, comprising a body tube including said first moving part, wherein a filter is provided at an opening of the body tube.

EMBODIMENT 51

The apparatus according to embodiment 50, wherein any one of polypropylene, zirconium, boron, silicon, silicon nitride and beryllium is used for said filter.

EMBODIMENT 52

An exposure apparatus comprising the positioning apparatus according to embodiment 26, wherein said optical element is driven by said positioning apparatus.

EMBODIMENT 53

A method for producing a device, comprising:
an exposure step of exposing a body to be exposed using the exposure apparatus according to embodiment 52; and
a developing step of developing said exposed step.

EMBODIMENT 54

An exposure apparatus comprising the positioning apparatus according to embodiment 30, wherein said optical element is driven by said positioning apparatus.

EMBODIMENT 55

A method for producing a device, comprising:
an exposure step of exposing a body to be exposed using the exposure apparatus according to embodiment 54; and
a developing step of developing said exposed step.

As described above, according to this Example, a moving table including an optical element can be positioned with high accuracy.

What is claimed is:

1. A positioning apparatus comprising:
first measurement means for measuring a position and/or inclination of a moving part having an optical element while not being in contact with said moving part, the optical element being part of an optical system to guide light to expose; and
driving means capable of driving said moving part in directions of six axes with respect to a fixed part while not being in contact with said moving part, based on the result of measurement by said first measurement means.

2. The apparatus according to claim 1, wherein said driving means comprises at least six pairs of micro adjustment mechanisms capable of being controlled independently.

3. The apparatus according to claim 1, wherein said driving means comprises a first magnetic block in at least one of said fixed part and said moving part, and a coil in the other.

4. The apparatus according to claim 3, wherein said driving means comprises a first magnetic block in said moving part and a coil in said fixed part.

5. The apparatus according to claim 1, wherein said driving means comprises a first magnetic block in at least one of said fixed part and said moving part, and an electromagnet in the other.

6. The apparatus according to claim 5, wherein said driving means comprises a first magnetic block in said moving part and an electromagnet in said fixed part.

7. The apparatus according to claim 3, wherein said first magnetic block is a permanent magnet.

8. The apparatus according to claim 1, wherein said first measurement means comprises at least one of a laser interferometer, an encoder, an eddy current sensor and an electric capacity sensor.

9. The apparatus according to claim 1, comprising support means for adding a force to said moving part in an antigravity direction.

10. The apparatus according to claim 9, wherein said support means adds a force to said moving part while not being in contact with said moving part.

11. The apparatus according to claim 9, wherein said support means comprises an elastic member coupling said fixed part with said moving part.

12. The apparatus according to claim 9, wherein said support means adds a force substantially equal to the gravity of said moving part to said moving part in an antigravity direction.

13. The apparatus according to claim 1, comprising any one of a bellow, a repulsive magnet, a suction magnet and a spring.

14. The apparatus according to claim 1, wherein said first measurement means is fixed to said fixed part.

15. The apparatus according to claim 1, wherein said moving part is said optical element, and the optical element comprises a target for use in said first measurement means.

16. The apparatus according to claim 1, wherein said optical element is a reflection member.

17. An exposure apparatus comprising:
the optical element; and
the positioning mechanism according to claim 1, wherein said optical element is driven by said positioning apparatus.

18. The apparatus according to claim 17, comprising:
an optical system including said optical element, guiding light emitted from a light source to a mask, and guiding light passing through the mask to a body to be exposed;
a structure frame supporting the optical system and said fixed part; and
second measurement means for measuring a position and/or inclination of said fixed part with respect to said structure, wherein said driving means drives said optical element based on the results of measurement by said first measurement means and said second measurement means.

19. The apparatus according to claim 18, comprising third means for measuring a position and/or inclination of said structure frame with respect to a basic structure that is different from said structure frame, wherein said driving means drives said optical element based on the results of measurement by said first measurement means, said second measurement means and said third measurement means.

20. The apparatus according to claim 17, comprising:
an optical system including said optical element, guiding light emitted from a light source to a mask, and guiding light passing through the mask to a body to be exposed;
a structure frame supporting the optical system and said fixed part; and
second measurement means for measuring a position and/or inclination of said fixed part with respect to a basic structure that is different from said structure frame, wherein said driving means drives said optical element based on the results of measurement by said first measurement means and said fourth measurement means.

21. The apparatus according to claim 17, comprising wave aberration measurement means for measuring a wave aberration of said optical system, wherein said measurement means is calibrated by the wave aberration measurement means.

22. The apparatus according to claim 17, wherein the inside of said optical system is kept under vacuum.

23. The apparatus according to claim 17, wherein the wavelength of light passing through said optical system is 13 to 14 nm.

24. The apparatus according to claim 17, comprising cooling means for cooling both said optical element and said driving means by radiation.

25. A method for producing a device;
comprising:
an exposure step of exposing a body to be exposed using the exposure apparatus of claim 17; and
a developing step of developing said exposed body.

26. A positioning apparatus comprising:
a first moving part including an optical element, the optical element being part of an optical system to guide light to expose a body;
a first fixed part;
first driving means for driving said first moving part with respect to said first fixed part;
first measurement means for measuring a position of said first moving part with respect to said first fixed part;
second measurement means for measuring a displacement of said first moving part with respect to a basic structure; and
a first compensator controlling said first driving means based on the result of measurement by said second measurement means, wherein said optical element is positioned using said first driving means, said second measurement means and said first compensator, based on the result of measurement by said first measurement means.

27. The apparatus according to claim 26, comprising wave aberration measurement means for measuring a wave aberration of an optical system including said optical element, wherein said optical element is positioned based on the result of measurement by said wave aberration measurement means.

28. The apparatus according to claim 27, wherein said first driving means, said second measurement means and said first compensator position said optical element based on the result of measurement by said first measurement means, and then position said optical element based on the result of measurement by said wave aberration measurement means.

29. The apparatus according to claim 26, wherein said first measurement means comprises an electric capacity sensor and/or an eddy current sensor and/or a differential trans-displacement sensor and/or laser interferometer.

30. A positioning apparatus comprising:
a first moving part including a first optical element, the first optical element being part of an optical system to guide light to expose a body;
a first fixed part;
first driving means for driving said first moving part with respect to said first fixed part;
a second moving part including a second optical element;
a second fixed part;
second driving means for driving said second moving part with respect to said second fixed part;
first measurement means for measuring a relative displacement between said first moving part and said second moving part;
a first compensator controlling said first driving means based on information of measurement by said third measurement means; and
a second compensator controlling said second driving means based on information of measurement by said third measurement means, wherein said first optical element and said second optical element are positioned using said first compensator and said second compensator.

31. The apparatus according to claim 30, comprising wave aberration measurement means for measuring a wave aberration of an optical system including said first optical element and said second optical element, wherein said first optical system and said second optical system are positioned based on the result of measurement of said wave aberration measurement means.

32. The apparatus according to claim 30, wherein said first measurement means comprises:
second measurement means for measuring relative positions of said first moving part and said second moving part with respect to a first direction at three or more locations;
third measurement means for measuring relative positions of said first moving part and said second moving part with respect to a second direction perpendicular to said first direction at two or more locations; and
fourth measurement means for measuring relative positions of said first moving part and said second moving part with respect to a third direction perpendicular to both said first direction and said second direction.

33. The apparatus according to claim 32, wherein said first direction is almost identical to the direction of the optical axis of said optical element.

34. The apparatus according to claim 32, wherein said second measurement means and said third measurement means comprise:
a first mirror fixed on said first moving part, a polarization beam splitter fixed on said second moving part;
a second mirror fixed on said second moving part;
¼λ plate placed between said polarization beam splitter and said first mirror and between said polarization beam splitter and said second mirror;
a laser light source and a detector provided on almost the opposite side of said first mirror with respect to said polarization beam splitter; and
a corner cube prism provided on almost the opposite side of said second mirror with respect to the polarization beam splitter.

35. The apparatus according to claim 32, wherein said second measurement means and said third measurement means comprise:
a bar mirror fixed on a basic structure;
a first polarization beam splitter fixed on the first moving part;
a first mirror fixed on the first moving part 1;
¼λ plate provided between the first polarization beam splitter, and the first mirror and the bar mirror;
a first laser light source and a first detector provided on almost the opposite side of the first mirror with respect to the first polarization beam splitter;
a first corner cube prism provided on almost the opposite side of the bar mirror with respect to the first polarization beam splitter;
a second polarization beam splitter fixed on the second moving part;
a second mirror fixed on the second moving part;

¼λ plate provided between the second polarization beam splitter, and the second mirror and the bar mirror;

a second laser light source and a second detector provided on almost the opposite side of the second mirror with respect to the second polarization beam splitter; and a second corner cube prism provided on almost the opposite side of the bar mirror with respect to the second reflection beam splitter.

36. The apparatus according to claim 32, wherein said second measurement means and said third measurement means comprise:

a bar mirror fixed on the basic structure;

a first mirror fixed on the first moving part;

a polarization beam splitter fixed on the second moving part;

¼λ plate provided between the deflection splitter, and the first mirror and the bar mirror;

a laser light source provided on almost the opposite side of the first mirror with respect to the polarization beam splitter; and a detector provided on almost the opposite side of the bar mirror with respect to the polarization beam splitter.

37. The apparatus according to claim 32, wherein said second measurement means and said third measurement means comprise:

a prism fixed on the first moving part;

a polarization beam splitter fixed on the second moving part;

a mirror fixed on the moving part 2;

an inclination mirror fixed on the moving part 2;

a ¼λ plate provided between the polarization beam splitter and the mirror;

a ¼λ plate provided between the prism and the inclination mirror;

a detector provided on almost the opposite side of the mirror with respect to the polarization beam splitter; and a laser light source provided on almost the opposite side of the prism with respect to the reflection beam splitter.

38. The apparatus according to claim 26, wherein said second measurement means comprises any one of a laser interferometer, an encoder, an electric capacity sensor, an eddy current sensor and/or a differential trans-displacement sensor.

39. The apparatus according to claim 30, wherein said first measurement sensor comprises any one of an encoder, an electric capacity sensor, an eddy current sensor and a differential trans-displacement sensor and/or laser interferometer.

40. The apparatus according to claim 26, wherein at least one of said first driving means and said second driving means use a six axis micro adjustment mechanism using a linear motor.

41. The apparatus according to claim 26;

wherein at least one of said first driving means and said second driving means use a six axis micro adjustment mechanism using an electromagnet actuator.

42. The apparatus according to claim 26, wherein at least one of said first driving means and said second driving means use a six axis micro adjustment mechanism using a piezoelectric element.

43. The apparatus according to claim 26, comprising cooling means cooling said optical element, wherein the cooling means is provided in said first fixed part and/or said second fixed part of said optical element positioning apparatus.

44. The apparatus according to claim 43, wherein said cooling means comprises a Peltier element.

45. The apparatus according to claim 26, comprising a vacuum bulkhead between said first moving part and said first fixed part and/or said second moving part and said second fixed part.

46. The apparatus according to claim 45, wherein a space on the first moving part side of said vacuum bulkhead and/or a space on the second moving side of said vacuum bulkhead are kept under high vacuum.

47. The apparatus according to claim 45, wherein any one of electrolytically polished aluminum, electrolytically polished stainless, titanium, ceramics, fluororesin and glass is used for said vacuum bulkhead.

48. The apparatus according to claim 26, comprising a body tube including said first moving part, wherein differential exhaust is used for an opening of the body tube, or purging gas is made to pass into the opening of the body tube.

49. The apparatus according to claim 48, wherein said purging gas is helium.

50. The apparatus according to claim 26, comprising a body tube including said first moving part, wherein a filter is provided at an opening of the body tube.

51. The apparatus according to claim 50, wherein any one of polypropylene, zirconium, boron, silicon, silicon nitride and beryllium is used for said filter.

52. An exposure apparatus comprising the positioning apparatus according to claim 26, wherein said optical element is driven by said positioning apparatus.

53. A method for producing a device, comprising:

an exposure step of exposing a body to be exposed using the exposure apparatus according to claim 52; and a developing step of developing said exposed body.

54. An exposure apparatus comprising the positioning apparatus according to claim 30, wherein said optical element is driven by said positioning apparatus.

55. A method for producing a device, comprising:

an exposure step of exposing a body to be exposed using the exposure apparatus according to claim 54; and a developing step of developing said exposed body.

* * * * *